(12) United States Patent
Maeda et al.

(10) Patent No.: US 7,932,594 B2
(45) Date of Patent: Apr. 26, 2011

(54) ELECTRONIC COMPONENT SEALING SUBSTRATE FOR HERMETICALLY SEALING A MICRO ELECTRONIC MECHANICAL SYSTEM OF AN ELECTRONIC COMPONENT

(75) Inventors: Toshihiko Maeda, Kirishima (JP); Katsuyuki Yoshida, Kirishima (JP); Kouzou Makinouchi, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 368 days.

(21) Appl. No.: 12/094,132

(22) PCT Filed: Nov. 16, 2006

(86) PCT No.: PCT/JP2006/322896
§ 371 (c)(1),
(2), (4) Date: May 16, 2008

(87) PCT Pub. No.: WO2007/058280
PCT Pub. Date: May 24, 2007

(65) Prior Publication Data
US 2009/0091018 A1 Apr. 9, 2009

(30) Foreign Application Priority Data

Nov. 16, 2005 (JP) ................................ 2005-331750
Nov. 25, 2005 (JP) ................................ 2005-340842
Dec. 7, 2005 (JP) ................................ 2005-353227

(51) Int. Cl.
*H01L 23/48* (2006.01)
(52) U.S. Cl. .......... 257/693; 257/698; 257/704; 438/51; 438/114
(58) Field of Classification Search .................. 257/693, 257/698, 704, E21.002; 438/51, 114
See application file for complete search history.

(56) References Cited

U.S. PATENT DOCUMENTS

| 4,574,255 | A | 3/1986 | Fujii et al. |
| 5,172,304 | A | 12/1992 | Ozawa et al. |
| 5,652,466 | A * | 7/1997 | Hirakawa et al. ............ 257/772 |
| 6,841,885 | B2 * | 1/2005 | Hosoi et al. .................. 257/778 |
| 2005/0167795 | A1 | 8/2005 | Higashi ........................ 257/678 |
| 2007/0040281 | A1* | 2/2007 | Nakayama et al. ........... 257/778 |

FOREIGN PATENT DOCUMENTS

| JP | 59172807 A | 9/1984 |
| JP | 02121392 A | 5/1990 |
| JP | 04-293310 | 10/1992 |

(Continued)

*Primary Examiner* — Phuc T Dang
(74) *Attorney, Agent, or Firm* — DLA Piper LLP (US)

(57) ABSTRACT

An electronic component sealing substrate capable of configuring an electronic apparatus in which the influence of electromagnetic coupling and radio frequency noises between an electrical connection path and a micro electronic mechanical system is suppressed is provided. An electronic component sealing substrate (4) for hermetically sealing a micro electronic mechanical system (4) of an electronic component (2) that includes a semiconductor substrate (5), the micro electronic mechanical system (3) formed on a main face of the semiconductor substrate (5), and an electrode (6) electrically connected to the micro electronic mechanical system (3), includes an insulating substrate (7) that has a first main face joined to the main face of the semiconductor substrate (5) so as to hermetically seal the micro electronic mechanical system (3), and a wiring conductor (8) that has an end extending to the first main face of the insulating substrate (7) and is electrically connected to the electrode (6) of the electronic component (2), and the end of the wiring conductor (8) is positioned outside a joined portion of the main face of the semiconductor substrate (5) and the first main face of the insulating substrate (7).

17 Claims, 9 Drawing Sheets

FOREIGN PATENT DOCUMENTS

| | | |
|---|---|---|
| JP | 05007063 A | 1/1993 |
| JP | 05-090882 | 4/1993 |
| JP | 09-219423 | 8/1997 |
| JP | 2004-209585 | 7/2004 |
| JP | 2005-072419 | 3/2005 |
| JP | 2005-072420 | 3/2005 |

* cited by examiner

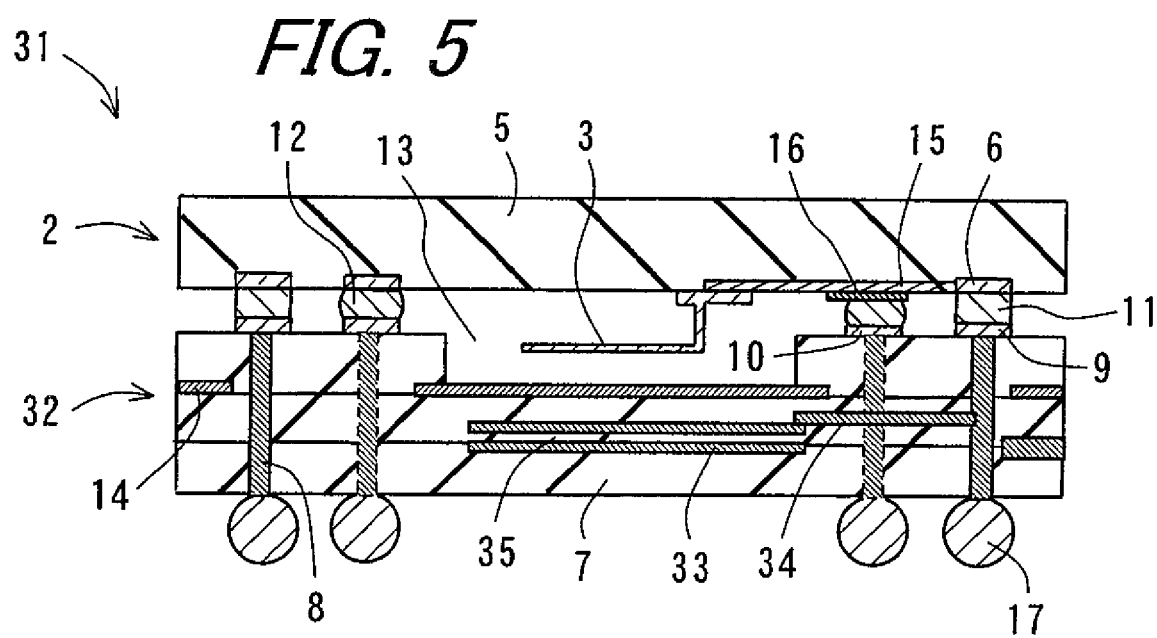

ELECTRONIC COMPONENT SEALING SUBSTRATE FOR HERMETICALLY SEALING A MICRO ELECTRONIC MECHANICAL SYSTEM OF AN ELECTRONIC COMPONENT

CROSS-REFERENCE TO THE RELATED APPLICATIONS

This application is a national stage of international application No. PCT/JP2006/322896 filed Nov. 16, 2006, which also claims benefit of priority under 35 U.S.C. §119 to Japanese Patent Application No. 2005-331750 filed Nov. 16, 2005, Japanese Patent Application No. 2005-340842 filed Nov. 25, 2005 and Japanese Patent Application No. 2005-353227 filed Dec. 7, 2005, the entire contents of all of which are incorporated herein by reference.

TECHNICAL FIELD

The present invention relates to an electronic component sealing substrate for sealing a micro electronic mechanical system of an electronic component, an electronic component sealing substrate to be divided into a plurality of pieces, an electronic apparatus formed by sealing the micro electronic mechanical system of the electronic component with the electronic component sealing substrate, and a method for producing the electronic apparatus.

BACKGROUND ART

Recently, electronic components have been attracting attention and developed for practical use, in which a so-called MEMS (micro electronic mechanical system) is formed on main faces of semiconductor substrates made of silicon wafer or other materials by application of processing techniques for forming fine wiring lines of elements in semiconductor integrated circuits and the like.

Trial production and development of this sort of micro electronic mechanical system is carried out in a very wide range of fields including accelerometers, pressure sensors, actuators, and other sensors, as well as micromirror devices and optical devices having movable micromirrors.

FIG. 9 is a cross-sectional view showing a configuration example of an electronic component on which this sort of micro electronic mechanical system is formed and a conventional electronic apparatus in which this electronic component is hermetically sealed. As shown in FIG. 9, an electrode 123 for supplying electric power to a micro electronic mechanical system 122 or for sending electrical signals from the micro electronic mechanical system 122 to an external electric circuit is formed so as to be electrically connected to the micro electronic mechanical system 122, on a main face of a semiconductor substrate 121 on which the micro electronic mechanical system 122 is formed. The semiconductor substrate 121, the micro electronic mechanical system 122, and the electrode 123 constitute one electronic component 124.

An electronic apparatus is formed by accommodating the electronic component 124 in a recess A for accommodating an electronic component, which is contained in a package for accommodating an electronic component (hereinafter, also simply referred to as a 'package') 131, connecting the electrode 123 of the electronic component 124 via a conductive connecting member such as a bonding wire 133 to an electrode pad 132 of the package 131, and then placing a lid 134 over the recess A of the package 131 to hermetically seal the electronic component 124 in the recess A. In this case, the electronic component 124 has to be hermetically sealed in such a manner that an internal space is kept therein, in order not to disturb the operation of the micro electronic mechanical system 122.

In this electronic apparatus, when a wiring conductor 135 that has been formed so as to be extended from the electrode pad 132 of the package 131 to the external surface is connected to an external electric circuit, the hermetically sealed micro electronic mechanical system 122 is electrically connected via the electrode 123, the bonding wire 133, the electrode pad 132, and the wiring conductor 135 to the external electric circuit.

This sort of electronic component 124 is produced by arranging a plurality of micro electronic mechanical systems 122 in a matrix on a main face of a semiconductor mother substrate having a large area, and dividing the semiconductor mother substrate into pieces. However, this method has a poor productivity in production of electronic apparatuses and is difficult to put to practical use. The reason for this is as follows. When the micro electronic mechanical systems 122 are separated by a dicing process or the like, the cutting process has to be performed after each electronic component 124 is protected, in order to prevent a powder formed by cutting the semiconductor mother substrate made of silicon or other materials from getting attached to the micro electronic mechanical systems 122 and damaging the micro electronic mechanical systems 122. Furthermore, each electronic component 124 has to be hermetically sealed individually inside the package 131.

A method has been disclosed for producing an electronic device on which the MEMS is mounted by application of a process for wafer level packaging (see Japanese Unexamined Patent Publication JP-A 2004-209585, for example). In the electronic device produced using this method, in a junction portion between a substrate on whose main face the MEMS is formed and a lid that is placed over the MEMS and joined to the substrate, an electrode connected to the MEMS is electrically connected to a wiring conductor of the lid. With this production method, an electronic device on which the MEMS is mounted can be efficiently produced at low cost.

Recently, the micro electronic mechanical system is used in, for example, radio frequency (RF) technologies. Thus, there has been a demand for further downsizing of an electronic apparatus that includes an electronic component containing a micro electronic mechanical system and an electronic component sealing substrate for sealing the micro electronic mechanical system.

However, in accordance with the above-mentioned downsizing, an electrical connection path through which an electrode electrically connected to the micro electronic mechanical system extends to an external electric circuit is positioned closer to the micro electronic mechanical system, and thus electromagnetic interferences are easily caused therebetween. Accordingly, there is the problem that reliability tends to be lowered by, for example, instability in the mechanical and electrical operation of the micro electronic mechanical system inside the electronic apparatus.

Furthermore, there is the problem that the characteristics of transmission of radio frequency signals passing through the electrical connection path may deteriorate due to the influence of noises caused by turning on and off an electric field for generating an electrostatic force or a magnetic field for generating a magnetic force when driving the micro electronic mechanical system.

DISCLOSURE OF INVENTION

The invention was devised in order to solve these problems, and it is an object thereof to provide an electronic component sealing substrate capable of configuring an electronic apparatus in which the influence of electromagnetic coupling and radio frequency noises between an electrical connection path and a micro electronic mechanical system is suppressed, an electronic component sealing substrate to be divided into a plurality of pieces, an electronic apparatus including the electronic component sealing substrate, and a method for producing the electronic apparatus at high productivity.

The invention is directed to an electronic component sealing substrate for hermetically sealing a micro electronic mechanical system of an electronic component that includes a semiconductor substrate, the micro electronic mechanical system formed on a main face of the semiconductor substrate, and an electrode electrically connected to the micro electronic mechanical system, comprising:

an insulating substrate that has a first main face joined to the main face of the semiconductor substrate so as to hermetically seal the micro electronic mechanical system; and a wiring conductor that has an end extending to the first main face of the insulating substrate and is electrically connected to the electrode of the electronic component, the end of the wiring conductor being positioned outside a joined portion of the main face of the semiconductor substrate and the first main face of the insulating substrate. This electronic component sealing substrate is referred to as a 'first electronic component sealing substrate'.

It is preferable that the first electronic component sealing substrate further comprises a conductor layer to which a reference potential is supplied, inside the insulating substrate. This electronic component sealing substrate is referred to as a 'second electronic component sealing substrate'.

It is preferable that the first electronic component sealing substrate further comprises:

at least one pair of capacitance forming electrodes that are formed inside the insulating substrate and are electrically connected to the wiring conductor; and a resistor that is formed inside the insulating substrate and is electrically connected to the capacitance forming electrodes. This electronic component sealing substrate is referred to as a 'third electronic component sealing substrate'.

In the third electronic component sealing substrate, it is preferable that relative permittivity of the insulating substrate between the capacitance forming electrodes is higher than that of the other regions. This electronic component sealing substrate is referred to as a 'fourth electronic component sealing substrate'.

It is preferable that the third or fourth electronic component sealing substrate further comprises a connection pad that is formed on the first main face of the insulating substrate and is electrically connected to the end of the wiring conductor, the resistor is disposed directly under the connection pad inside the insulating substrate, and a distance between the capacitance forming electrodes and the connection pad is longer than that between the resistor and the connection pad. This electronic component sealing substrate is referred to as a 'fifth electronic component sealing substrate'.

In the fifth electronic component sealing substrate, it is preferable that the resistor is constituted by the connection pad or a part of the wiring conductor adjacent to the connection pad. This electronic component sealing substrate is referred to as a 'sixth electronic component sealing substrate'.

In any one of the third to sixth electronic component sealing substrates, it is preferable that a conductor layer to which a reference potential is supplied, is disposed between the first main face and the capacitance forming electrodes of the insulating substrate. This electronic component sealing substrate is referred to as a 'seventh electronic component sealing substrate'.

It is preferable that any one of the first to seventh electronic component sealing substrates further comprises a plurality of mounting pads that are formed on a second main face opposing the first main face of the insulating substrate, the mounting pads are arranged in mounting regions on the second main face, and the mounting regions oppose no more than three divided regions among four divided regions on the first main face, obtained by dividing the first main face along dividing lines that pass through a center of an internal region of the joined portion of the semiconductor substrate and the insulating substrate and that divide the region into quarters. This electronic component sealing substrate is referred to as an 'eighth electronic component sealing substrate'.

It is preferable that any one of the first to seventh electronic component sealing substrates further comprises a plurality of mounting pads that are formed on a second main face opposing the first main face of the insulating substrate, the mounting pads are arranged on mounting lines on the second main face, and the mounting lines oppose no more than three dividing half lines among four dividing half lines on the first main face that divide an internal region of the joined portion of the semiconductor substrate and the insulating substrate into quarters and that extend from a center of the region to an outer periphery thereof. This electronic component sealing substrate is referred to as a 'ninth electronic component sealing substrate'.

Moreover, the invention is directed to an electronic component sealing substrate to be divided into a plurality of pieces, comprising a plurality of regions each of which constitutes any one of the first to ninth electronic component sealing substrates.

Moreover, the invention is directed to an electronic apparatus, comprising:

any one of the first to ninth electronic component sealing substrates; and an electronic component that includes a semiconductor substrate, a micro electronic mechanical system formed on a main face of the semiconductor substrate, and an electrode electrically connected to the micro electronic mechanical system. This electronic component is referred to as a 'first electronic apparatus'.

In the first electronic apparatus, it is preferable that the electronic component sealing substrate comprises a conductor layer to which a reference potential is supplied, inside the insulating substrate, the main face of the semiconductor substrate and the first main face of the insulating substrate are joined via a sealing member made of a conductive material for hermetically sealing the micro electronic mechanical system, and the sealing member is electrically connected to the conductor layer. This electronic component is referred to as a 'second electronic component'.

It is preferable that the first or second electronic component further comprises:

a connection pad that is formed on the first main face of the insulating substrate and is electrically connected to the end of the wiring conductor; and a conductive connecting member that is formed on the connection pad and electrically connected to the electrode of the electronic component. This electronic component is referred to as a 'third electronic component'.

It is preferable that the third electronic component comprises a resin material with which a space between the main face of the semiconductor substrate and the first main face of the insulating substrate is filled such that the conductive junction member is coated with the resin material toward an outside of the sealing member.

Moreover, the invention is directed to a method for producing an electronic apparatus, comprising:

a step of preparing an electronic component substrate to be divided into a plurality of pieces in which a plurality of electronic component regions in each of which a micro electronic mechanical system and an electrode electrically connected to the micro electronic mechanical system are formed on a semiconductor substrate;

a step of preparing an electronic component sealing substrate to be divided into a plurality of pieces;

a step of hermetically sealing the micro electronic mechanical system, by electrically connecting the respective electrodes of the electronic component substrate to be divided into a plurality of pieces and the end of the corresponding wiring conductor, and joining a main face of the semiconductor substrate and one main face of the insulating substrate; and a step of dividing a joined member of the electronic component substrate to be divided into a plurality of pieces and the electronic component sealing substrate to be divided into a plurality of pieces, into the electronic component regions.

BRIEF DESCRIPTION OF DRAWINGS

Other and further objects, features, and advantages of the invention will be more explicit from the following detailed description taken with reference to the drawings.

FIG. 5 is a cross-sectional view showing a configuration example of an electronic apparatus that includes an electronic component sealing substrate according to the second embodiment of the invention.

BEST MODE FOR CARRYING OUT THE INVENTION

Figure 1A:
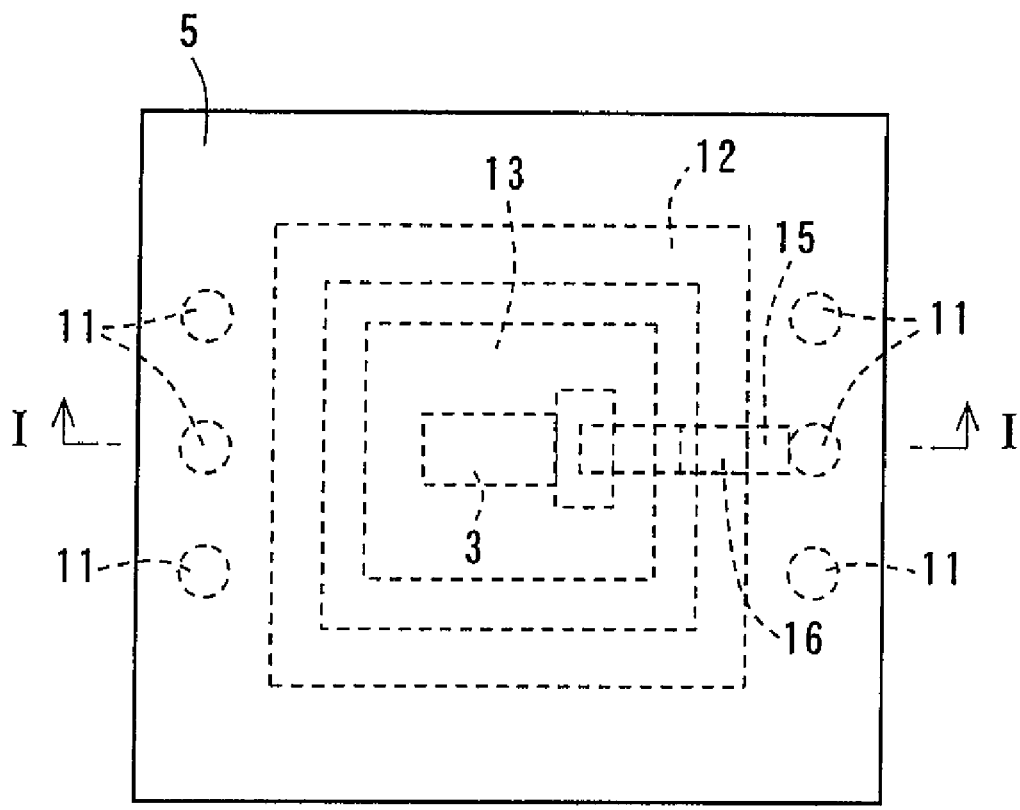
FIG. 1A is a plan view showing a configuration example of embodiment of a wiring substrate and an electronic apparatus including an electronic component sealing substrate according to a first embodiment of the invention.

Now referring to the drawings, preferred embodiments of the invention are described below.

First Embodiment

Figure 1B:
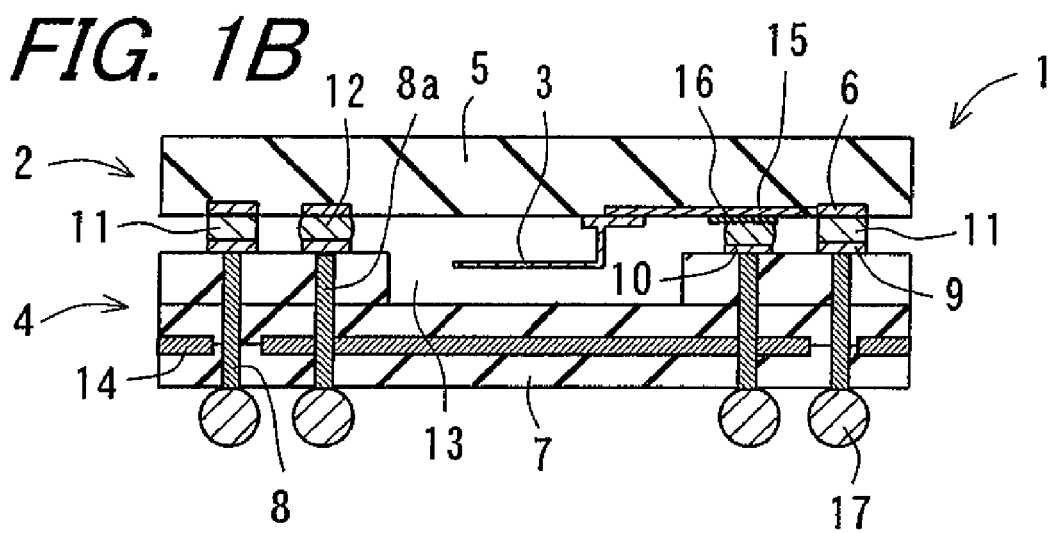
FIG. 1B is a cross-sectional view taken along cut line I-I in the electronic apparatus shown in FIG. 1A.

FIG. 1A is a plan view showing a configuration example of an electronic apparatus including an electronic component sealing substrate according to a first embodiment of the invention. FIG. 1B is a cross-sectional view taken along cut line I-I in the electronic apparatus shown in FIG. 1A. As shown in FIGS. 1A and 1B, an electronic apparatus 1 according to this embodiment includes an electronic component 2, and an electronic component sealing substrate 4 for sealing a micro electronic mechanical system 3 that is contained in the electronic component 2. The electronic component 2 includes a semiconductor substrate 5, the micro electronic mechanical system 3 that is formed on a main face of the semiconductor substrate 5, and an electrode 6 that is electrically connected to the micro electronic mechanical system 3. The electronic component sealing substrate 4 includes an insulating substrate 7, a wiring conductor 8 that is formed through the insulating substrate 7, a connection pad 9 and an annular conductive pattern 10 that are formed on one of the main faces of the insulating substrate 7, a conductive junction member 11 that is formed on the connection pad 9, and a sealing member 12 that is formed on the annular conductive pattern 10.

The connection pad 9 on the insulating substrate 7 is electrically connected via the conductive junction member 11 to the electrode 6 of the electronic component 2. Furthermore, the insulating substrate 7 is joined via the annular conductive pattern 10 and the sealing member 12 to a main face of the semiconductor substrate 5, thereby hermetically sealing the micro electronic mechanical system 3.

When the micro electronic mechanical system 3 of the electronic component 2 is sealed using the electronic component sealing substrate 4, the electronic apparatus 1 is formed in which the micro electronic mechanical system 3 is sealed so as to be externally connectable.

The micro electronic mechanical system 3 in the invention refers to electronic elements having the function of, for example, electrical switches, inductors, capacitors, resonators, antennas, microrelays, optical switches, magnetic heads for hard disks, microphones, biosensors, DNA chips, microreactors, printheads, and acceleration sensors, pressure sensors, and other various sensors, and display devices. These electronic elements are produced by so-called micromachining based on semiconductor fine processing techniques, and have a size of approximately 10 to several hundreds of micrometers per element.

The insulating substrate 7 functions as a lid for sealing the micro electronic mechanical system 3 and as a base for forming the connection pad 9 and the annular conductive pattern 10.

The insulating substrate 7 is made of a ceramic material such as an aluminum oxide-based sintered compact, an aluminum nitride-based sintered compact, a mullite-based sintered compact, a carbide-based sintered compact, a silicon nitride-based sintered compact, or a glass ceramic sintered compact.

In a case where the insulating substrate 7 is made of an aluminum oxide-based sintered compact, the insulating substrate 7 is formed by laminating green sheets that are obtained by shaping raw material powders such as an aluminum oxide and a glass powder into sheets and firing the laminate. The insulating substrate 7 does not necessarily have to be made of an aluminum oxide-based sintered compact, and an appropriate material is preferably selected according to the intended use, the characteristics of the micro electronic mechanical system 3 that is to be hermetically sealed, or the like.

The insulating substrate 7 is mechanically joined via the sealing member 12 to the semiconductor substrate 5. Accordingly, in order to improve the reliability of joining between the insulating substrate 7 and the semiconductor substrate 5, that is, the airtightness in sealing of the micro electronic mechanical system 3, the insulating substrate 7 is preferably made of a material whose coefficient of thermal expansion is not significantly different from that of the semiconductor substrate 7. Examples of such a material include a mullite-based sintered compact, as well as a glass ceramic sintered compact such as an aluminum oxide-borosilicate glass-based sintered compact whose coefficient of thermal expansion has been approximated to that of the semiconductor substrate 5 by adjustment of the type or the amount of glass components.

A glass ceramic sintered compact obtained by sintering glass in which borosilicate glass-based substances are contained in aluminum oxide fillers allows the wiring conductor 8 to be made of copper or silver whose electrical resistance is small, and has low relative permittivity thereby being capable of preventing electrical signal delay. Thus, such a glass ceramic sintered compact is preferably used as the material of the insulating substrate 7 for radio frequency signals.

There is no specific limitation on the shape of the insulating substrate 7, as long as the insulating substrate 7 can function as a lid for sealing the micro electronic mechanical system 3 and as a base for forming the connection pad 9 and the annular conductive pattern 10.

A recess 13 for internally accommodating the micro electronic mechanical system 3 of the electronic component 2 may be formed on the upper face of the insulating substrate 7 shown in FIG. 1B, that is, the main face of the insulating substrate 7 sealing the micro electronic mechanical system 3. When the micro electronic mechanical system 3 is partially accommodated inside the recess 13, it is possible to lower the height of the sealing member 12 for enclosing the micro electronic mechanical system 3. Thus, this configuration is advantageous in lowering the height of the electronic apparatus 1. Furthermore, in order to downsize the electronic apparatus 1, the insulating substrate 7 viewed from above is preferably in the shape of a rectangular in which each outer side has a length of approximately several millimeters, for example.

The annular conductive pattern 10 has a shape for internally accommodating the micro electronic mechanical system 3, on the upper face of the insulating substrate 7. The annular conductive pattern 10 functions as a brazing metal layer for joining the sealing member 12 that defines a space in which the micro electronic mechanical system 3 is sealed.

The annular conductive pattern 10 is made of, for example, a metal material such as copper, silver, gold, palladium, tungsten, molybdenum, or manganese.

In a case where the annular conductive pattern 10 is made of copper, the annular conductive pattern 10 is formed by applying a paste for electrodes by screen printing or the like to green sheets that are to be formed into the insulating substrate 7, and firing the paste together with the green sheets, the paste being obtained by adding an appropriate organic binder and solvent to a copper powder and a glass powder and mixing the resultant.

The sealing member 12 has a size for internally accommodating the micro electronic mechanical system 3, on the annular conductive pattern 10. The sealing member 12 is interposed between the semiconductor substrate 5 and the insulating substrate 7.

The sealing member 12 functions as a side wall inside which the micro electronic mechanical system 3 of the electronic component 2 is to be hermetically sealed. Herein, in a case where the upper face of the electronic component sealing substrate 4 is flat, the thickness of the sealing member 12 corresponds to the thickness of the space in which the micro electronic mechanical system 3 is sealed. Accordingly, the space in which the micro electronic mechanical system is sealed can be defined with a simple structure.

The sealing member 12 is made of, for example, a metal material known as a joining member, a conductive adhesive such as an epoxy resin containing a metal powder, or a resin material such as an epoxy resin adhesive. Examples of the metal material include a solder such as a tin-silver-based solder and a tin-silver-copper-based solder, a low-melting brazing filler metal such as a gold-tin brazing filler metal, and a high-melting brazing filler metal such as a silver-germanium-based brazing filler metal.

Furthermore, the sealing member 12 may be formed, for example, by forming a conductive film or the like constituted by a layer of metal such as Au, Ag, Cu, Al, Pt, or Pd using a plating method on an iron-nickel-based alloy such as an iron-nickel-cobalt alloy or an iron-nickel alloy, oxygen-free copper, aluminum, stainless steel, a copper-tungsten alloy, a copper-molybdenum alloy, or other metal materials, or an aluminum oxide-based sintered compact, a glass ceramic sintered compact, or other inorganic materials, and then applying a solder such as a tin-silver-based solder or a tin-silver-copper-based solder onto the conductive film. It should be noted that the sealing member 12 may be made of either a conductive material or an insulating material.

In a case where the sealing member 12 is made of a solder, the sealing member 12 made of a solder may be formed on the annular conductive pattern 10 by applying a solder paste onto the annular conductive pattern 10 and heating the solder paste so as to be joined to the annular conductive pattern 10.

In the electronic apparatus 1 shown in FIGS. 1A and 1B, the micro electronic mechanical system 3 is hermetically sealed inside the sealing member 12 by joining the sealing member 12 to the lower face of the semiconductor substrate 5.

The sealing member 12 may be joined to the main face of the semiconductor substrate 5, via a joining member that is made of, for example, a solder such as a tin-silver-based solder, a low-melting brazing filler metal such as a gold-tin brazing filler metal, or a high-melting brazing filler metal such as a silver-germanium-based brazing filler metal.

In a case where the sealing member 12 is made of a solder applied onto the annular conductive pattern 10, the insulating substrate 7 is mechanically joined via the sealing member 12 to the semiconductor substrate 5 by positioning the annular conductive pattern 10 of the insulating substrate 7 and the semiconductor substrate 5 via a solder paste, and melting the solder paste using means for reflow, etc. A sealing space in which the micro electronic mechanical system 3 is hermetically sealed is defined inside the sealing member 12.

The connection pad 9 that is electrically connected to the electrode 6 of the electronic component 2 is formed on the upper face of the insulating substrate 7. In the electronic apparatus 1 according to this embodiment, the connection pad 9 is connected to the wiring conductor 8 that is formed through the insulating substrate 7. The wiring conductor 8 is, for example, a through conductor that passes through the insulating substrate 7 in the thickness direction, and has been extended to the lower face of the insulating substrate 7, that is, the main face of the insulating substrate 7 opposing the main face for sealing the micro electronic mechanical system 3. It should be noted that the wiring conductor 8 may be extended to a side face of the insulating substrate 7. Herein, the wiring conductor 8 may be constituted by a hole through green sheet layers that are fired to be the insulating substrate 7, and an internal conductor between the green sheet layers.

A mounting pad (not shown) is formed on an end of the wiring conductor 2 that has been extended to the lower face or the side face of the insulating substrate 7. When the mounting pad is joined, for example, via an external terminal 17 constituted by a solder bump made of a tin-lead solder or other materials to an external electric circuit, the electrode 6 of the electronic component 2 is electrically connected to the external electric circuit.

The wiring conductor 8 and the connection pad 9 are electrically connected via the conductive junction member 11 formed on the connection pad 9, to the electrode 6 of the electronic component 2. The wiring conductor 8 and the connection pad 9 function to extend the electrode 6 to the lower face or the side face of the insulating substrate 7 such that electrical connection to the external electric circuit is established.

The conductive junction member 11 is made of a metal material, e.g., a solder such as a tin-silver-based solder or a tin-silver-copper-based solder, a low-melting brazing filler metal such as a gold-tin brazing filler metal, or a high-melting brazing filler metal such as a silver-germanium-based brazing filler metal, or a conductive adhesive such as an epoxy resin containing a metal powder.

In a case where the sealing member 12 is made of a metal material, e.g., a solder such as a tin-silver-based solder or a tin-silver-copper-based solder, a low-melting brazing filler metal such as a gold-tin brazing filler metal, or a high-melting brazing filler metal such as a silver-germanium-based brazing filler metal, the sealing member 12 and the conductive junction member 11 can be formed all at once by vacuum evaporation, plating, or applying and melting a brazing filler metal paste. Accordingly, the productivity of the electronic apparatus 1 can be improved.

When the conductive junction member 11 is joined to the electrode 6 of the electronic component 2, the electrode 6 of the electronic component 2 extends via the conductive junction member 11, the connection pad 9, and the wiring conductor 8, to the lower face or the side face of the insulating substrate 7. Then, when the end of the wiring conductor 8 that has been extended to the lower face or the side face of the insulating substrate 7 is joined via a tin-lead solder or other materials to an external electric circuit, the electrode 6 of the electronic component 2 and the external electric circuit are electrically connected.

The wiring conductor 8 and the connection pad 9 are made of a metal material such as copper, silver, gold, palladium, tungsten, molybdenum, or manganese.

In a case where the wiring conductor 8 is made of copper, the wiring conductor 8 is formed by applying a copper paste by screen printing or the like to green sheets that are to be formed into the insulating substrate 7, and firing the paste together with the green sheets, the paste being obtained by adding an appropriate organic binder and solvent to a copper powder and a glass powder and mixing the resultant.

As described above, the upper face of the insulating substrate 7 constituting the electronic component sealing substrate 4 and the lower face of the semiconductor substrate 9 constituting the electronic component 2 are placed opposing each other, positioned and joined to each other, and thus the micro electronic mechanical system 3 is sealed. More specifically, the insulating substrate 7 and the semiconductor substrate 5 are joined via the sealing member 12 that is interposed between the annular conductive pattern 10 and the semiconductor substrate 5, and thus the micro electronic mechanical system 3 is hermetically sealed inside the sealing member 12. The electrode 6 electrically connected to the micro electronic mechanical system 3 extends out of the sealing space via the conductive junction member 11, the connection pad 9, and the wiring conductor 8, and is electrically connected to an external electric circuit. Accordingly, signals can be exchanged between the micro electronic mechanical system 3 and the external electric circuit. These signals are transmitted between the micro electronic mechanical system 3 and the external electric circuit, through the electrode 6, the conductive junction member 11, the connection pad 9, and the wiring conductor 8.

In the electronic component sealing substrate 4, the connection pad 9 is formed outside the annular conductive pattern 10. Since the connection pad 9 is disposed outside the annular conductive pattern 10 to which the sealing member 12 is to be attached, the connection pad 9 and the micro electronic mechanical system 3 can be spaced away from each other by the distance defined according to the annular conductive pattern 10. Accordingly, electromagnetic interferences between the connection pad 9 and the micro electronic mechanical system 3 are suppressed. Thus, for example, when a drive voltage is applied via the conductive junction member 11 to the micro electronic mechanical system 3, it is possible to suppress the influence of electromagnetic interferences caused by turning on and off the drive voltage, on the operation of the micro electronic mechanical system 3.

Furthermore, in a case where a radio frequency signal is transmitted through the conductive junction member 11, it is also possible to suppress deterioration of the characteristics of the radio frequency signal transmitted through the conductive junction member 11 due to noises caused by turning on and off a magnetic field or an electric field necessary for driving the micro electronic mechanical system 3.

Thus, it is possible to provide the electronic component sealing substrate 4 in which the influence of radio frequency noises between the conductive junction member 11 and the micro electronic mechanical system 3 can be suppressed.

Herein, the sealing member 12 is for sealing the micro electronic mechanical system 3, and the annular conductive pattern 10 to which the sealing member 12 is to be attached is formed on the insulating substrate 7. Thus, the micro electronic mechanical system 3 can be easily and reliably sealed by the sealing member 12 in the electronic component sealing substrate 4.

In the electronic component sealing substrate 4, a conductor layer to which a reference potential is supplied may be formed inside the insulating substrate 7. In FIG. 1B, a conductor layer (hereinafter, referred to as a 'ground conductor layer') 14 to which a ground potential is supplied is formed inside the insulating substrate 7. In a case where the ground conductor layer 14 is formed inside the insulating substrate 7, noises from the outside can be blocked. In a similar manner, in a case where a shielding conductor layer is formed on the upper face of the semiconductor substrate 5, noises from the outside can be further blocked.

The ground conductor layer 14 is formed using a material and a method similar to those of the wiring conductor 8 and the connection pad 9. For example, in a case where the ground conductor layer 14 is made of copper, the ground conductor layer 14 is formed by applying a paste for electrodes by screen printing or the like to green sheets that are to be formed into the insulating substrate 7, and firing the paste together with the green sheets, the paste being obtained by adding an appropriate organic binder and solvent to a copper powder and a glass powder and mixing the resultant.

In a case where the ground conductor layer 14 is disposed inside the insulating base 1, electromagnetic waves that would usually pass through the electronic component sealing substrate 4 and enter the region sealed by the sealing member 12 are effectively blocked by the ground conductor layer 14. Thus, it is possible to block noises from the outside that would usually enter the region in which the micro electronic mechanical system 3 is sealed. As a result, the electronic component 2 on which the micro electronic mechanical system 3 is mounted can operate more normally and stably.

When the electronic component 2, in which the micro electronic mechanical system 3 and the electrode 6 electrically connected thereto are formed on the main face (the lower face in FIG. 1B) of the semiconductor substrate 5, is configured such that the electrode 6 is joined to the connection pad 9 and the main face of the semiconductor substrate 5 is joined to the sealing member 12, the electronic apparatus 1 is formed in which the micro electronic mechanical system 3 of the electronic component 2 is hermetically sealed inside the sealing member 12.

In the electronic apparatus 1 according to this embodiment, the electrode 6 formed on the lower face of the semiconductor substrate 5 and the connection pad 9 are connected via the conductive junction member 11 outside the sealing space in which the micro electronic mechanical system 3 is accommodated. Thus, the conductive junction member 11 and the micro electronic mechanical system 3 can be spaced away from each other by the distance defined according to the annular conductive pattern 10. As a result, when a voltage for turning on and off a drive voltage is supplied via the conductive junction member 11, it is possible to suppress electromagnetic interferences caused by turning on and off the drive voltage, to the operation of the micro electronic mechanical system 3.

Furthermore, in a case where a radio frequency signal is transmitted through the conductive junction member 11, it is also possible to suppress deterioration of the characteristics of the radio frequency signal transmitted through the conductive junction member 11 due to noises caused by turning on and off a magnetic field or an electric field necessary for driving the micro electronic mechanical system 3.

Herein, it is preferable that the sealing member 12 is made of a conductive material, and electrically connected to the ground conductor layer 14 of the electronic component sealing substrate 4 or connected to a ground wiring line of a printed wiring board (not shown) on which the electronic component sealing substrate 4 is mounted via the wiring conductor 8 (shown as a wiring conductor 8a in FIG. 1B), which is a through conductor disposed through the electronic component sealing substrate 4.

When the sealing member 12 is made of a conductive material and joined to the ground conductor layer of the electronic component sealing substrate 4 or the ground conductor layer of the printed wiring board on which the electronic component sealing substrate 4 is mounted in this manner, a stable ground network is formed between the sealing member 12 and the ground conductor layer, and the sealing member 12 can be provided with good electromagnetic shielding properties. As a result, the electronic component 2 in which the micro electronic mechanical system 3 is formed can operate more reliably, normally, and stably.

Herein, the sealing member 12 may be electrically connected to one of, or both of, the ground conductor layer 14 in the electronic component sealing substrate 4 and the ground conductor layer of the printed wiring board on which the electronic component sealing substrate 4 is mounted.

In a case where the sealing member 12 is made of a conductive material, a metal material may be used as the conductive material. Examples of the metal material include a solder such as tin-silver-based solder and a tin-silver-copper-based solder, a low-melting brazing filler metal such as a gold-tin brazing filler metal, and a high-melting brazing filler metal such as a silver-germanium-based brazing filler metal. In a case where the sealing member 12 is made of such a material, the sealing member 12 and the conductive junction member 11 can be formed at the same time.

Furthermore, the sealing member 12 and the conductive junction member 11 may be made of the same brazing filler metal. In a case where the sealing member 12 and the conductive junction member 11 are made of the same material, the conductive junction member 11 and the sealing member 12 can be formed all at once by vacuum evaporation, plating, or applying and melting a solder paste. As a result, productivity can be improved.

Furthermore, in a case where the sealing member 12 is made of a conductive material and electrically connected to a ground terminal of an external printed wiring board via the wiring conductor 8a that is disposed through the electronic component sealing substrate 4, it is preferable that a plurality of wiring conductors 8a are arranged inside the insulating substrate 7, and that the gap between adjacent wiring conductors 8a is set to not greater than half of the wave length of a radio frequency signal (a radio frequency signal approximately in a several hundreds of megahertz to 100 GHz band, in particular, a GHz band) that is used in the electronic component 2.

With this configuration, no radio frequency noise enters a region enclosed by the wiring conductors 8a, and mismatch of the propagation mode caused by instability in the radio frequency ground is reduced. Furthermore, since electrical connection is directly established between the sealing member 12 made of a conductive material and the ground conductor layer 14, the ground network path can be shortened, and inductance component can be prevented from increasing. Accordingly, a stable ground can be obtained, and good electromagnetic shielding properties can be kept. Thus, the micro electronic mechanical system 3 is less affected by radio frequency noises entering from the outside.

Thus, even in a case where this sort of radio frequency signal is used, the signal is transmitted via the wiring conductor 8 always correctly to the electronic component 2, and thus the electronic component 2 driven at high speed can operate more normally and stably.

A wiring conductor 15 formed on the semiconductor substrate 5 functions as a wiring line through which a signal is transmitted between the electrode 6 and the micro electronic mechanical system 3. In a case where the sealing member 12 is made of a conductive material, it is preferable to form an insulating film 16 made of a silicon oxide or other materials on the wiring conductor 15, in order to prevent a short-circuit from occurring between the sealing member 12 and the wiring conductor 15.

In the thus configured electronic apparatus 1, when the extended portion of the wiring conductor 8 is connected via the external terminal 17 constituted by a solder ball or the like to an external electric circuit, the micro electronic mechanical system 3 is electrically connected to the external electric circuit.

When connecting the external electric circuit and the electronic apparatus 1 via a solder ball or the like, it is preferable to connect the external electric circuit and the electronic apparatus 1, at a temperature not greater than the temperature at which the semiconductor substrate 5 and the electronic component sealing substrate 4 are joined, in view of the reliability of joining between the semiconductor substrate 5 and the electronic component sealing substrate 8.

Figure 2:
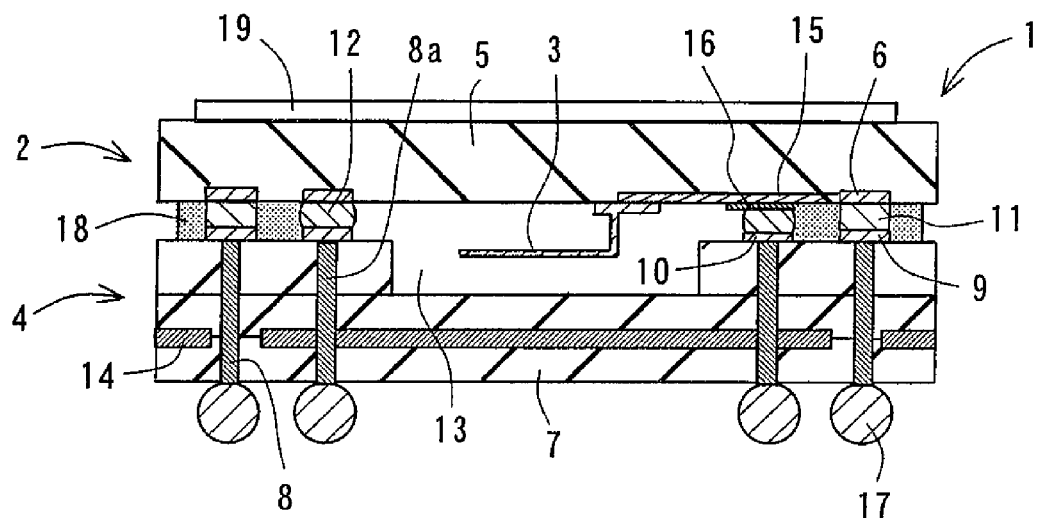
FIG. 2 is a cross-sectional view showing another configuration example of the electronic apparatus including the electronic component sealing substrate according to a first embodiment of the invention.

Furthermore, as shown in FIG. 2, a space outside the sealing member 12, between the lower face of the semiconductor substrate 5 and the upper face of the electronic component sealing substrate 7, may be filled with a resin material 18 such that the conductive junction member 11 is coated with the resin material 18. In a case where the space is filled with the resin material 18, thermal stress generated by the difference between the coefficients of thermal expansion of the semiconductor substrate 5 and the electronic component sealing substrate 7 is distributed throughout the filled resin, and thus an excessive stress can be prevented from being applied to the conductive junction member 11 and the sealing member 12. Furthermore, infiltration of water can be suppressed, and thus cracks in the conductive junction member 11 and the sealing member 12 and corrosion of the conductive junction member 11 and the sealing member 12 can be effectively suppressed. As a result, the reliability of the electronic apparatus can be improved.

Moreover, as shown in FIG. 2, a shielding conductor layer 19 may be formed on the upper face of the semiconductor substrate 5. In this case, electromagnetic waves that would usually pass through the semiconductor substrate 5 and enter the region in which the micro electronic mechanical system 3 is sealed are effectively blocked by the shielding conductor layer 19. Thus, it is possible to block noises from the outside. As a result, the electronic component 2 on which the micro electronic mechanical system 3 is mounted can operate more normally and stably. Herein, the shielding conductor layer 19 is a metal layer that is formed on the semiconductor substrate 5, for example, by evaporation or the like.

It is preferable that the upper face of the electronic component sealing substrate 4 constituting the electronic apparatus 1 has the recess 13 as described above, and that the micro electronic mechanical system 3 is accommodated inside the recess 13.

In this case, the thickness of the electronic apparatus 1 corresponding to the height of the micro electronic mechanical system 3 can be reduced. As a result, for example, the height of the electronic apparatus 1 can be lowered as required in the mobile phone market and the like.

Furthermore, in this electronic apparatus 1, it is preferable that the upper face of the electronic component sealing substrate 4 is flat, and that the thickness of the sealing space is set to correspond to that of the sealing member 12.

In this case, the space in which the micro electronic mechanical system 3 is sealed can be defined with a simple structure. As a result, the productivity of the electronic component sealing substrate 4 and the electronic apparatus 1 can be improved.

Figure 3:
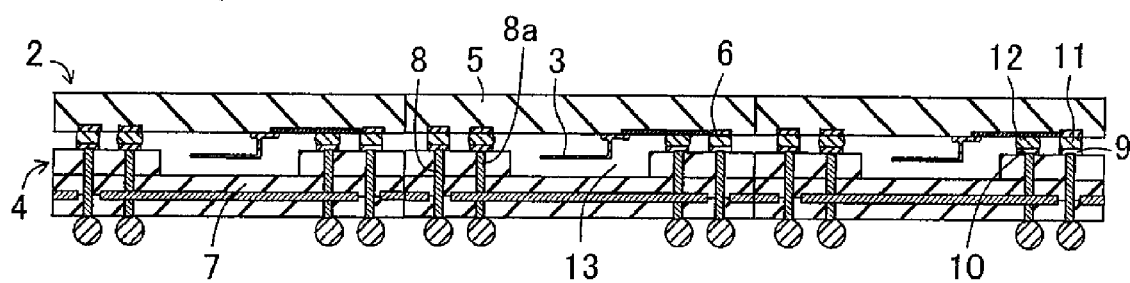
FIG. 3 is a cross-sectional view showing a configuration example in a case where the electronic component sealing substrate according to the first embodiment is obtained from an electronic component sealing substrate to be divided into a plurality of pieces.

FIG. 3 is a cross-sectional view showing a configuration example in a case where the electronic component sealing substrate according to this embodiment is obtained from an electronic component sealing substrate to be divided into a plurality of pieces. As shown in FIG. 3, substrate regions so-called 'to be divided into a plurality of pieces' may be in a matrix on one of the main faces of a wiring mother substrate having a large area, each substrate region including the connection pad 9 and the sealing member 12.

With such a configuration to be divided into a plurality of pieces, a plurality of semiconductor mother substrates produced in a plurally arranged form, in which a plurality of micro electronic mechanical systems 3 and a plurality of electrodes 6 electrically connected thereto are formed on a main face of the semiconductor substrates 5, can be hermetically sealed at the same time. Thus, excellent productivity is realized.

Next, a method for producing an electronic apparatus using the electronic component sealing substrate 4 will be described with reference to FIGS. 4A to 4D. FIGS. 4A to 4D show an example of the method for producing electronic apparatuses according to this embodiment in the order of processes. In FIGS. 4A to 4D, the same configurations as in FIGS. 1A and 1B and FIG. 3 are denoted by the same reference numerals. For the sake of simplicity, a part of the configuration shown in FIGS. 1A and 1B and FIG. 3, such as the ground conductor layer 14, has been omitted.

Figure 4A:
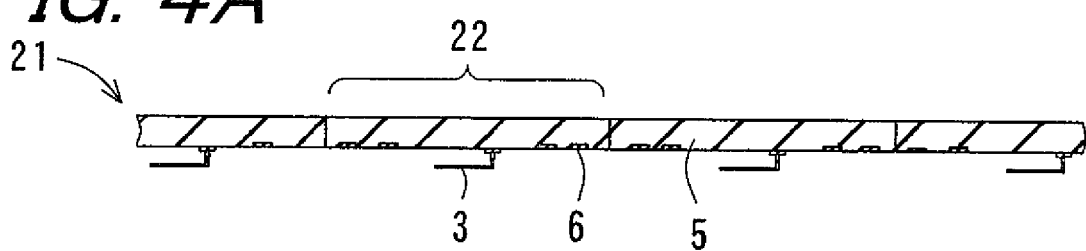
FIGS. 4A to 4D are views showing an example of the method for producing electronic apparatuses according to the first embodiment in order of processes.

First, as shown in FIG. 4A, a semiconductor mother substrate 21 whose lower face has a plurality of micro electronic mechanical systems 3 arranged in a matrix is prepared. The lower face of the semiconductor mother substrate 21 has the electrodes 6 respectively corresponding to the micro electronic mechanical systems 3. The semiconductor mother substrate 21 is a semiconductor substrate on which a plurality of electronic component regions 22 respectively including the micro electronic mechanical systems 3 and the electrodes 6 are formed.

Figure 4B:
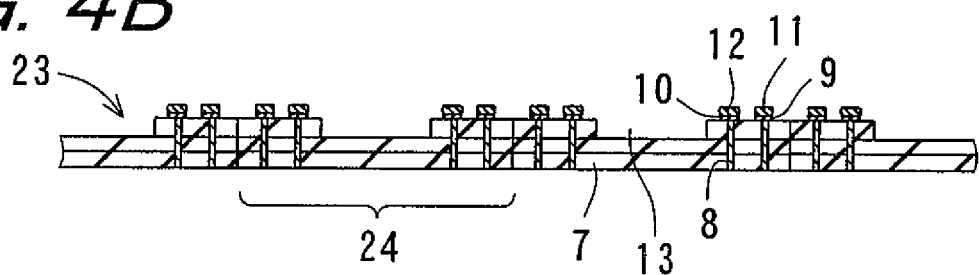

Next, as shown in FIG. 4B, a wiring mother substrate 23 is prepared. The wiring mother substrate 23 has a plurality of substrate regions 24 corresponding to the micro electronic mechanical systems 3.

Each of the substrate regions 24 is a region that is to be formed into the electronic component sealing substrate 4. The annular conductive pattern 10 and the connection pad 9 positioned outside the annular conductive pattern 10 are formed on one of the main faces of each region that is to be formed into the electronic component sealing substrate 4. The connection pad 9 is electrically connected to the wiring conductor 8 that has been extended from one of the main faces of the insulating substrate 7 to the other main face or the side face.

In the electronic apparatus according to this embodiment, the sealing member 12 is formed in advance on the annular conductive pattern 10, and the conductive connecting member 11 is formed in advance on the connection pad 9. With this configuration, mechanical joining (sealing) using the sealing member 12 and electrical connection using the conductive junction member 11 can be easily performed at the same time. Thus, the work efficiency in sealing the electronic component can be improved.

The sealing member 12 is formed on the annular conductive pattern 10. In a case where the sealing member 12 is made of, for example, an iron-nickel-cobalt alloy, the sealing member 12 is formed by rolling, punching with a mold, or etching a metal plate made of an iron-nickel-cobalt alloy, and shaping the resultant into an annular conductive pattern.

The sealing member 12 and the insulating substrate 7 may be joined via a solder such as a tin-silver-based solder, a low-melting brazing filler metal such as a gold-tin brazing filler metal, or a high-melting brazing filler metal such as a silver-germanium-based brazing filler metal.

Furthermore, the sealing member 12 may be made of a solder such as a tin-silver-based solder, a low-melting brazing filler metal such as a gold-tin brazing filler metal, or a high-melting brazing filler metal such as a silver-germanium-based brazing filler metal.

The conductive junction member 11 is formed on the connection pad 9. In a case where the conductive junction member 11 is made of, for example, a solder such as a tin-silver-based solder, the conductive junction member 11 is formed by positioning this solder ball on the connection pad 9, and then heating to melt the solder ball for joining. In a case where the conductive junction member 11 and the sealing member 12 are made of the same material, the conductive junction member 11 and the sealing member 12 may be formed all at once.

Figure 4C:
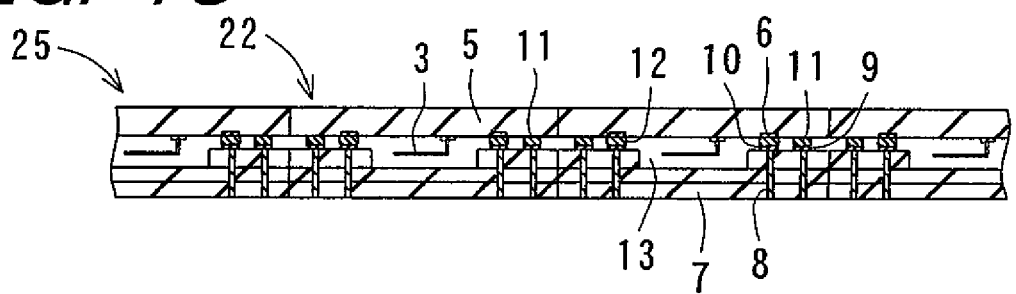

Next, as shown in FIG. 4C, a joined member 25 is formed by joining the semiconductor mother substrate 21 onto the wiring mother substrate 23 via the sealing members 12 that hermetically seal the micro electronic mechanical systems 3 in the respective substrate regions 24.

The joined member 25 is configured so that a plurality of electronic apparatuses 1 can be obtained from the joined member. In the joined member 25, the micro electronic mechanical systems 3 arranged in a matrix are hermetically sealed in the sealing spaces inside the sealing members 12 in the respective the substrate regions 24.

Furthermore, the electrode 6 corresponding to each of the micro electronic mechanical systems 3 is electrically connected via the conductive junction member 11 to the corresponding connection pad 9.

Herein, in a case where the conductive junction member 11 is made of a tin-silver-based solder and the conductive junction member 11 and the sealing member 12 have the same height, the electrode 6 and the conductive junction member 11 are joined, for example, by positioning the conductive junction member 11 on the electrode 6, and thermally treating the conductive junction member 11 and the electrode 6 at a temperature of approximately 250 to 300° C. in a reflow furnace.

Herein, the main face of the semiconductor substrate 5 and the sealing member 12 may be joined, for example, by placing a tin-silver-based solder similar to the conductive junction member 11 between the faces that are to be joined, and thermally treating the semiconductor substrate 5 and the sealing member 12 in a reflow furnace at the same time when the electrode 6 and the conductive junction member 11 are joined. Furthermore, in a case where the conductive junction member 11 is made of a tin-silver-based solder, and the heights of the conductive junction member 11 and the sealing member 12 are not uniform or the wiring mother substrate 23 is warped, for example, the semiconductor mother substrate 21 and the wiring mother substrate 23 can be joined by thermocompression bonding at a temperature of approximately 220 to 280° C.

As described above, with the method for producing the electronic apparatus 1 according to this embodiment, joining for externally extending the electrode 6 of the electronic component region 22 and joining for hermetically sealing the micro electronic mechanical system 3 can be performed at the same time. Thus, the productivity of the electronic apparatus 1 can be significantly improved.

Figure 4D:
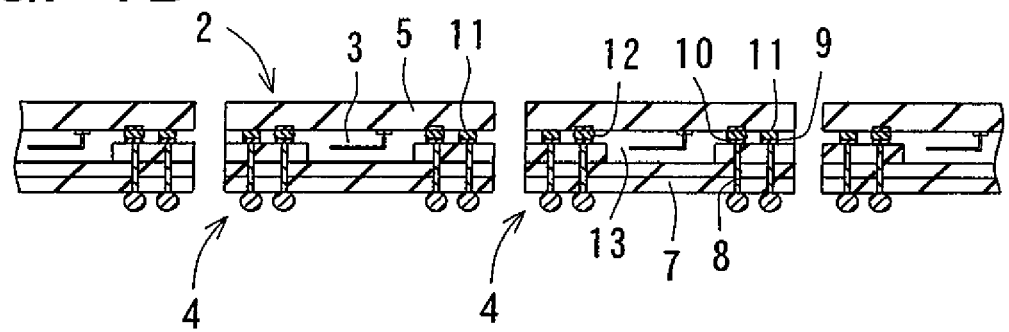

Then, as shown in FIG. 4D, the electronic apparatuses 1 are obtained by dividing the joined member 25 into the electronic component sealing regions 22.

In the thus produced electronic apparatus 1, the semiconductor mother substrate 21 is sealed using the wiring mother substrate 23 in which the annular conductive pattern 10 and the connection pad 9 positioned outside the annular conductive pattern 10 are formed on the upper face of each of the substrate regions 24 that are to be formed into the electronic component sealing substrates 4, as described above. Moreover, a plurality of electronic apparatuses 1 can be obtained all at once. Accordingly, the electronic apparatuses 1 in which electromagnetic interferences between the micro electronic mechanical system 10, and the connection pad 9 and the conductive junction member 11 are suppressed can be produced with good productivity.

The joined member 25 can be cut by performing a cutting process such as a dicing process on the joined member 25. Herein, in a case where the conductive junction member 11 is formed outside the sealing member 12 that hermetically seals the micro electronic mechanical system 3, the conductive junction member 11 that joins the micro electronic mechanical system 3 and the electronic component sealing substrate 4 can be checked by a visual inspection. As a result, it is not necessary to inspect the joining using X-rays or the like, in contrast to the case where the conductive junction member 11 is formed inside the sealing member 12.

Furthermore, even in a case where the conductive junction member 11 is made of a solder ball, and a molten solder may stick out from the electrode 6, the solder is blocked by the sealing member 12, and thus the solder is prevented from reaching the micro electronic mechanical system 3. Thus, the solder is effectively prevented from disturbing the mechanical operation of the micro electronic mechanical system 3 or lowering the reliability of the electrical operation. Accordingly, good reliability of the electronic apparatus 1 can be secured.

The method for producing the electronic apparatus 1 according to this embodiment includes the above-described processes. Thus, the plurality of micro electronic mechanical systems 3 arranged in a matrix can be hermetically sealed at the same time using the wiring mother substrate 23 that has the plurality of substrate regions 24 corresponding to the micro electronic mechanical systems 3. The joined member 25 constituted by the semiconductor mother substrate 21 and the wiring mother substrate 23 that have been joined can be easily produced. The electronic apparatuses 1 are formed by dividing the joined member 25 along the substrate regions 24, and thus the plurality of electronic apparatuses 1 can be reliably produced at high productivity.

Furthermore, the conductive junction member 11 is formed outside the sealing member 12 that hermetically seals the micro electronic mechanical system 3, and thus it is possible to judge with a visual inspection whether or not the electrical connection between the electrode 6 and the electronic component sealing substrate 4 is reliably established. Moreover, it is possible to prevent a connecting material forming the conductive junction member 11 from flowing toward the micro electronic mechanical system 3.

In the description above, one micro electronic mechanical system 3 was hermetically sealed inside one electronic apparatus 1. However, a plurality of micro electronic mechanical systems 3 may be hermetically sealed inside one electronic apparatus 1. Furthermore, in the example shown in FIGS. 4A to 4D, the wiring conductor 8 was extended toward the lower face of the insulating substrate 7. However, the wiring conductor 8 may be extended to the side face or both the side face and the lower face. Furthermore, in the example shown in FIGS. 4A to 4D, an example was described in which a recess (cavity) for accommodating the micro electronic mechanical system 3 is formed. However, such a recess does not necessarily have to be formed. A sealing space necessary for the micro electronic mechanical system 3 may be formed by setting the height of the sealing member 12 as appropriate.

Furthermore, the external terminal 17 via which the wiring conductor 8 is electrically connected to an external electric circuit may be, for example, a lead terminal or a conductive adhesive, instead of a solder ball.

Furthermore, in the description above, a substrate made of a ceramic material was used as the insulating substrate 7. However, the substrate may be made of other material such as resin or glass. Also, in the description above, the semiconductor substrate 5 and the insulating substrate 7 were joined via the annular conductive pattern 10 and the sealing member 12 in order to hermetically seal the micro electronic mechanical system 3. However, there is no limitation to this, as long as the semiconductor substrate 5 and the insulating substrate 7 can be joined. For example, the semiconductor substrate 5 and the insulating substrate 7 may be directly joined by anodic bonding, using an insulating substrate 7 made of glass.

Second Embodiment

Next, a second embodiment of the invention will be described.

An electronic component sealing substrate according to the second embodiment of the invention is different from the apparatus for sealing the electronic component according to the first embodiment in that an oscillation circuit is included inside the insulating substrate 7. FIG. 5 is a cross-sectional view showing a configuration example of an electronic apparatus that includes an electronic component sealing substrate according to the second embodiment of the invention. In the electronic apparatus 31 shown in FIG. 5, a pair of capacitance forming electrodes 33 that are electrically connected to the connection pad 9 and a resistor 34 that is electrically connected to the capacitance forming electrodes 33 are formed inside the insulating substrate 7 constituting an electronic component sealing substrate 32. The capacitance forming electrodes 33 oppose each other, and the capacitance forming electrodes 33 and a part of the insulating substrate 7 (hereinafter, referred to as an 'insulating layer 35') that is positioned therebetween constitute a capacitor (capacitor component). Furthermore, this capacitor and the resistor 34 constitute a CR oscillation circuit. In FIG. 5, the same configurations as in FIGS. 1A and 1B through FIGS. 4A to 4D are denoted by the same reference numerals, and a description thereof has been omitted.

The CR oscillation circuit has a function of transmitting an electrical signal detected by the micro electronic mechanical system 3 on a radio frequency signal as radio waves. More specifically, the CR oscillation circuit generates radio frequency waves (carrier waves) carrying, through the air, a signal sensed by the micro electronic mechanical system 3 that is a sensor. The carrier waves are transmitted as radio waves via a transmission apparatus such as an antenna (not shown) to the outside.

With the electronic component sealing substrate 32 according to this embodiment, the CR oscillation circuit is formed inside the insulating substrate 7. Thus, it is not necessary to provide a wiring line or a conductive junction member for mounting a capacitor and a resistor as additional chip components on the electronic component sealing substrate 32. Thus, transmission loss of signals can be reduced, and electric power consumption can be reduced. Accordingly, it is possible to obtain the electronic component sealing substrate 32 and the electronic apparatus 31 that can improve the drive precision of the micro electronic mechanical system 3 and the response precision of the electronic apparatus 21 and can be driven for a longer time.

Furthermore, it is not necessary to provide a space for mounting chip components, which has been necessary for an external electric circuit board. Thus, a smaller module can be formed. This aspect contributes to downsizing and electric power saving in the entire equipment. Moreover, another circuit, component, or the like can be mounted in the vacant space, and thus higher functions and higher density of the equipment can be realized.

Furthermore, since the oscillation circuit is formed inside the insulating substrate 7, there is no portion at which the conductive path is disconnected, such as a junction portion of a connection terminal electrode of a chip capacitor or chip resistor component and a conductive junction member. Thus, it is possible to suppress generation of electromagnetic noises. Accordingly, it is possible to minimize electromagnetic interferences to the micro electronic mechanical system 3 or other circuit boards to the extent possible. As a result, it is possible to obtain the electronic apparatus 31 with good response precision in which the highly precise micro electronic mechanical system 3 can operate with high precision.

The resistor 34 and the capacitance forming electrodes 33 can be electrically connected, for example, by bringing a part of the resistor 34 and a part of the capacitance forming electrodes 33 into direct contact with each other.

Furthermore, the resistor 34 can be electrically connected via a part of the wiring conductor 8 such as via conductor to the connection pad 9, and the capacitance forming electrodes 33 can be electrically connected via the wiring conductor 8 and the resistor 34 to the connection pad 9.

The capacitance forming electrodes 33 are formed using a material and means similar to those of the wiring conductor 8 and the connection pad 9. Conductive patterns as the pair of capacitance forming electrodes 33 are constituted by, for example, rectangular or circular conductive patterns that are vertically arranged. In this case, the outer edge of one of the pair of conductive patterns may be positioned outside that of the other conductive pattern such that the area at which the conductive patterns oppose each other is kept constant even in a case where the laminating position of green sheets or the like that are to be formed into the insulating substrate 7 is displaced.

Furthermore, it is preferable that the capacitance of the capacitor formed by the capacitance forming electrodes 33 and the insulating layer 35 is approximately in a range of from 0.5 pF to 50 nF. In a case where the capacitance is larger than 0.5 pF, production of the capacitor is less affected by tolerance. In a case where the capacitance is smaller than 50 nF, downsizing and production are easy.

The insulating layer 35 that is interposed between the pair of capacitance forming electrodes 33 is a part of the insulating substrate 7, and made of, for example, an insulating material (dielectric material) similar to that constituting the other portions in the insulating substrate 7.

Furthermore, the resistor 34 is electrically connected to the capacitance forming electrodes 33. The resistor 34 is made of, for example, a ruthenium oxide or silver palladium. Examples of means for forming the resistor 34 include means for laminating a metal as a thin film layer, such as metallized layer forming means, plated layer forming means, and evaporated film forming means. For example, with the metallized layer forming means, the resistor 34 is formed by performing printing with a ruthenium oxide paste onto green sheets that are to be formed into the insulating substrate 7, laminating the green sheets with the paste, and firing the paste together with the green sheets.

Furthermore, it is preferable that the electrical resistance of the resistor 34 is approximately in a range of from 10Ω to 100 kΩ. In a case where the electrical resistance is larger than 10Ω, production of the resistor 34 is less affected by tolerance. If the electrical resistance is smaller than 100 kΩ, downsizing and production are easy.

As described above, when the extended portion of the wiring conductor 8 in the electronic component sealing substrate 32 is connected via the external terminal 17 constituted by a solder ball or the like to an external electric circuit, the micro electronic mechanical system 3 is electrically connected to the external electric circuit. More specifically, external information such as mechanical vibrations detected by the micro electronic mechanical system 3 and converted into electrical signals is changed into carrier waves in the oscillation circuit that is constituted by the capacitance forming electrodes 33 and the resistor 34, and the carrier waves are supplied to the external electric circuit. The external electric circuit includes, for example, an amplifier, a filter, and an antenna that transmit radio waves according to the carrier waves.

In the electronic component sealing substrate 32, it is preferable that the relative permittivity of the insulating layer 35 that is disposed between the pair of capacitance forming electrodes 33 is higher than that of the other portions in the insulating substrate 7.

When the relative permittivity of at least a portion of the insulating substrate 7 interposed between the pair of capacitance forming electrodes 33, that is, the insulating layer 35, is higher than that of the other portions in this manner, the electrostatic capacitance generated between the capacitance forming electrodes 33 can be increased according to the difference between the relative permittivities.

Generally, the oscillating frequency band of a CR oscillation circuit can increase as the C value (electrostatic capacitance) increases. Thus, when a CR oscillation circuit having a large-capacitance capacitor is formed inside the insulating substrate 7, an oscillation circuit with good oscillation efficiency can be formed.

In the insulating substrate 7, when the relative permittivity of the insulating layer 35 is higher than that of the other portions, an CR oscillation circuit included in the insulating substrate 7 can have a larger-capacitance capacitor even with the same area. This aspect contributes to further downsizing and electric power saving in the equipment using the electronic apparatus 32.

For example, a case will be considered in which the insulating substrate 7 is made of an aluminum oxide-based material and has a relative permittivity of 10. In this case, when the insulating layer 35 has a relative permittivity of 10, the oscillating frequency band is approximately 1 kHz. When the insulating layer 35 has a relative permittivity of 1000, the band is approximately 3 kHz, that is, approximately three times larger than the above-shown value, and thus an oscillation circuit with good oscillation efficiency can be formed.

The insulating layer 35 with high relative permittivity is formed, for example, by performing print formation with a paste for dielectric layers, and co-firing the resultant with layers constituting the other portions of the insulating substrate 7, the paste being made of a dielectric powder, a sintering additive, an organic resin binder, and an organic solvent. Examples of the dielectric powder include substances with the perovskite structure, such as $SrTiO_3$, $MgTiO_3$, and $BaZrO_3$ in addition to $BaTiO_3$.

Examples of the sintering additive include glass such as $SiO_2$—$B_2O_3$-based glass, $SiO_2$—$B_2O_3$—$Al_2O_3$-based glass, $SiO_2$—$B_2O_3$—$Al_2O_3$—MO-based glass (where, M represents Ca, Sr, Mg, Ba, or Zn), $SiO_2$—$B_2O_3$-$M1_2O$-based glass (where, M1 represents to Li, Na, or K), $SiO_2$—$B_2O_3$—$Al_2O_3$-$M2_2O$-based glass (where, M2 represents the same substances as above), Pb-based glass, Bi-based glass, and a metal oxide such as CuO.

There is no specific limitation on the organic resin binder and the organic solvent used for the paste for dielectric layers, as long as these substances can be co-fired with the ceramic green sheets that are to be formed into the insulating substrate 7. For example, organic resin binders and organic solvents similar to those added to the green sheets can be used.

In this case, the capacitance forming electrodes 33 are formed by performing print formation with a paste for electrodes, and co-firing the resultant with the green sheets, the paste being made of 85 to 99.5 parts by mass of Cu or Ag powder, 0.5 to 15 parts by mass of crystallizable glass in which barium titanate crystal is precipitated, an organic resin binder, and an organic solvent.

it is preferable that the content of the crystallizable glass in which barium titanate crystal is precipitated is as small as possible with respect to the Cu or Ag powder, in order to prevent an interface between the dielectric layer 7 and the wiring conductor 8 constituting the insulating substrate 7 from being separated at the time of firing. In a case where the glass content of the crystallizable glass is smaller than 15 parts by mass with respect to the Cu or Ag powder, the characteristics of the insulating layer 35 can be prevented from deteriorating due to a large amount of glass component of the capacitance forming electrodes 33 flowing into the insulating layer 35 at the time of firing. In a case where the glass content of the crystallizable glass is larger then 0.5 part by mass, the crystallizable glass improves the wettability with $BaTiO_3$. Thus, separation of an interface between the insulating layer 35 and the capacitance forming electrodes 33 occurs less at the time of firing.

In a case where the Cu or Ag powder is used in the wiring conductor 8 for the insulating substrate 7, the powder preferably has a small particle size such as a diameter of 5 μm or less, in order to suppress mutual diffusion of the components of the insulating substrate 7 and the components of the insulating layer 35 at the time of firing.

At the time of crystallization of the crystallizable glass, BaO and $TiO_2$ are bonded to precipitate $BaTiO_3$ crystal. Since the $BaTiO_3$ crystal is precipitated as a main phase, the characteristics of the insulating layer 35 do not deteriorate even in a case where the crystallizable glass flows into the insulating layer 35 due to diffusion at the time of firing.

Furthermore, when the crystallizable-glass is added to the capacitance forming electrodes 33, the wettability of the insulating layer 35 and the capacitance forming electrodes 33 is improved. Thus, separation of the interface can be prevented from occurring at the time of firing.

In this case, the crystallizable glass is adjusted such that the glass content contains 55.1 to 59.7% by mass of BaO, 24.0 to 26.0% by mass of $TiO_2$, 7.7 to 11.3% by mass of $SiO_2$, 6.6 to 9.7% by mass of $Al_2O_3$, 0.7% by mass or less of SrO, 0.5% by mass or less of $Na_2O$, and 0.4% by mass or less of CaO, wherein the total of the components is 100% by mass. Since $TiO_2$, $SiO_2$, $Al_2O_3$, SrO, $Na_2O$, and CaO are network-forming oxides, intermediate oxides, and network-modifier oxides for vitrification, and thus the smallest ratio for vitrification is preferable. In a case where 59.7% by mass or less of BaO, 26.0% by mass or less of $TiO_2$, 7.7% by mass or less of $SiO_2$, and more than 6.6% by mass of $Al_2O_3$ are contained, this composition can be easily vitrified. Furthermore, in a case where more than 55.1% by mass of BaO, more than 24.0% by mass of $TiO_2$, more than 11.3% by mass of $SiO_2$, less than 9.7% by mass of $Al_2O_3$, less than 0.7% by mass of SrO, less than 0.5% by mass of $Na_2O$, and less than 0.4% by mass of CaO are contained, the amount of the components other than BaO or $TiO_2$ flowing into the insulating substrate 7 is suppressed, and thus the characteristics of the insulating substrate 7 can be prevented from deteriorating.

Examples of the glass in which crystal with high dielectric constant is precipitated include, not only the glass in which $BaTiO_3$ is precipitated, but also glass in which $NaNb_2O_5$ is precipitated. In the glass contained in the paste for electrodes, the same crystal phase as that in the insulating plate 1 is preferably precipitated. More specifically, when the main component of the insulating layer 35 is $BaTiO_3$, crystallizable glass in which $BaTiO_3$ is precipitated is preferably added to the paste for electrodes. When the main component of the insulating layer 35 is $NaNb_2O_5$, crystallizable glass in which $NaNb_2O_5$ is precipitated is preferably added to the paste.

It is preferable that the relative permittivity of the insulating layer 35 is approximately in a range of from 50 to 5000. In a case where the relative permittivity is 50 or more, the capacitor component is not too small. In a case where the relative permittivity is 5000 or less, the insulating layer 35 can be easily co-fired with the insulating substrate 7.

Furthermore, it is preferable that the resistor 34 is disposed directly under the connection pad 9 inside the insulating substrate 7. The distance between the capacitance forming electrodes 33 and the connection pad 9 is preferably longer than that between the resistor 34 and the connection pad 9. Herein, the distance between the capacitance forming electrodes 33 and the connection pad 9 refers to the shortest distance in a straight line that connects the capacitance forming electrodes 33 and the connection pad 9. The distance between the resistor 34 and the connection pad 9 refers to the shortest distance in a straight line that connects the resistor 34 and the connection pad 9.

When the resistor 34 is disposed directly under the connection pad 9 inside the insulating substrate 7, the wiring length between the CR oscillation circuit and the connection pad 9 can be further shortened. Thus, the electrical resistance between the resistor 34 and the connection pad 9 can be further reduced. Accordingly, transmission loss can be further reduced. As a result, the electronic apparatus 31 can be driven more precisely, has better response precision, and can be driven for a longer time due to electric power saving.

At the same time, the distance from the connection pad 9 to the capacitance forming electrodes 33 is longer than that to the resistor 34 disposed directly under the connection pad 9, and thus the capacitance forming electrodes 33 can be spaced away from the micro electronic mechanical system 3 to which the capacitance forming electrodes 33 are electrically connected via the connection pad 9 and the electrode 6.

Thus, it is possible to minimize, to the extent possible, interferences to the micro electronic mechanical system 3 caused by oscillating noises generated by the capacitor that is constituted by the capacitance forming electrodes 33, in particular, mechanical interferences such as disturbance for vibrations or other mechanical operations of the acceleration sensor. As a result, it is possible to prevent the oscillating noises from causing obstacles against highly precise driving or better response precision, and damaging or deforming the micro electronic mechanical system 3.

With this configuration, it is possible to seal, in particular, the electronic component 2 including the micro electronic mechanical system 3 that performs a mechanical operation, while securing extremely high reliability of operations such as sensing.

In a case where the distance between the capacitance forming electrodes 33 and the connection pad 9 is made longer than that between the resistor 34 and the connection pad 9, the resistor 34 and the capacitance forming electrodes 33 can be electrically connected, for example, by forming a connecting conductor (not shown) using means similar to that of the wiring conductor 2, from the resistor 34 to the capacitance forming electrodes 33.

In order to reduce interferences to the operation of the micro electronic mechanical system 3, in particular, the mechanical operation such as vibrations, the capacitance forming electrodes 33 are preferably arranged away from the micro electronic mechanical system 3, that is, disposed closer to the other main face of the insulating substrate 7. Herein, one of the pair of capacitance forming electrodes 33 may be exposed on the other main face of the insulating substrate 7.

Furthermore, in the electronic apparatus 31, it is possible to more effectively suppress the interferences, by forming no capacitance forming electrode 33 in the portion vertically overlapping with the micro electronic mechanical system 3.

The resistor 34 is made of, for example, a ruthenium oxide or silver palladium, and may be formed using means similar to that described above. More specifically, means for laminating a metal as a thin film layer, such as metallized layer forming means, plated layer forming means, evaporated film forming means, and the like may be used. For example, with the metallized layer forming means, the resistor 34 is formed by performing printing with a ruthenium oxide paste onto green sheets that are to be formed into the insulating substrate 7, laminating the green sheets with the paste, and firing the paste together with the green sheets.

When the printing with the ruthenium oxide paste is performed at the portion directly under the connection pad 9, on the green sheets that are to be formed into the insulating substrate 7, the resistor 34 can be disposed directly under the connection pad 9.

Also, the resistor 34 may be the connection pad 9 or at least a part of the wiring conductor 2 adjacent to the connection pad 9. More specifically, the resistance in the connection pad 9 or at least a part of the wiring conductor 2 functioning as the resistor 34 may be made higher than that in other portions.

In this case, the size of the electronic component sealing substrate 32 having an oscillating function and the electronic apparatus 31 can be made smaller than that in the case where the resistor 34 is additionally formed. More specifically, when the resistor 34 is constituted by the connection pad 9 or at least a part of the wiring conductor 8, the CR oscillation circuit can be formed whose distance is shorter than that in the case where the resistor 34 is additionally provided. Thus, a smaller and more efficient oscillation circuit can be formed.

In this case, the resistor 34 is formed by using a material such as a ruthenium oxide or silver palladium as the connection pad 9 or at least a part of the wiring conductor 8 adjacent to the connection pad 9.

Examples of means for forming the resistor 34 include means for laminating a metal as a thin film layer, such as metallized layer forming means, plated layer forming means, and evaporated film forming means. For example, with the metallized layer forming means, the resistor 34 is formed by performing printing with a ruthenium oxide paste onto green sheets that are to be formed into the insulating substrate 7, using predetermined patterns for the connection pad 9 or the wiring conductor 8 adjacent to the connection pad 9.

In a case where the wiring conductor 8 includes a through conductor, the wiring conductor 8 is formed, for example, by mechanically punching the green sheets to form a through hole, filling the through hole with the ruthenium oxide paste, laminating the green sheets with the paste, and firing the paste together with the green sheets.

Accordingly, the number of printing operations with a ruthenium oxide paste or the like can be reduced compared with the case in which the resistor 34 is provided with a different pattern. Thus, the productivity of the electronic component sealing substrate 32 and the electronic apparatus 31 can be improved.

Furthermore, in the electronic apparatus 31 according to this embodiment, the ground conductor layer 14 is preferably interposed between the capacitance forming electrodes 33 and the sealed micro electronic mechanical system (MEMS) 3 as shown in FIG. 5.

With this configuration, oscillating noises generated by the capacitance forming electrodes 33 of the oscillation circuit can be shielded by the ground conductor layer 14. As a result, it is possible to more reliably prevent the oscillating noises from causing obstacles against highly precise driving or better response precision, and damaging or deforming the micro electronic mechanical system 3.

This ground conductor layer 14 is formed using a material and means similar to those of the wiring conductor 2 and the connection pad 9.

Third Embodiment

Next, a third embodiment of the invention will be described.

Figure 6:
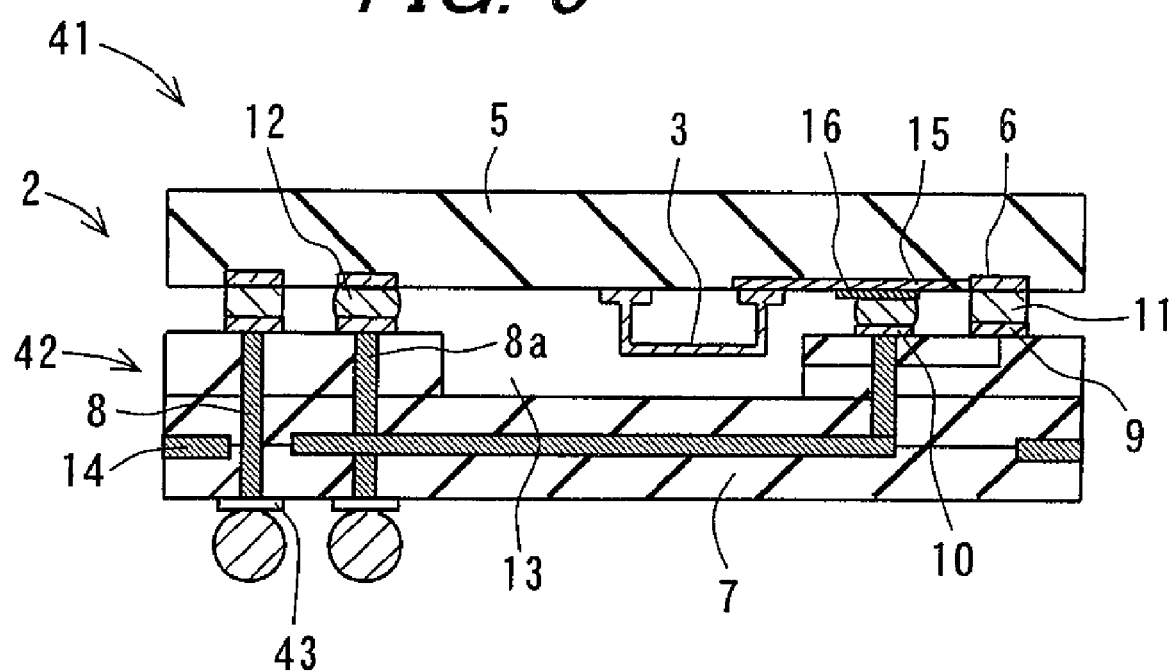
FIG. 6 is a cross-sectional view showing a configuration example of an electronic apparatus that includes an electronic component sealing substrate according to a third embodiment of the invention.
Figure 7:
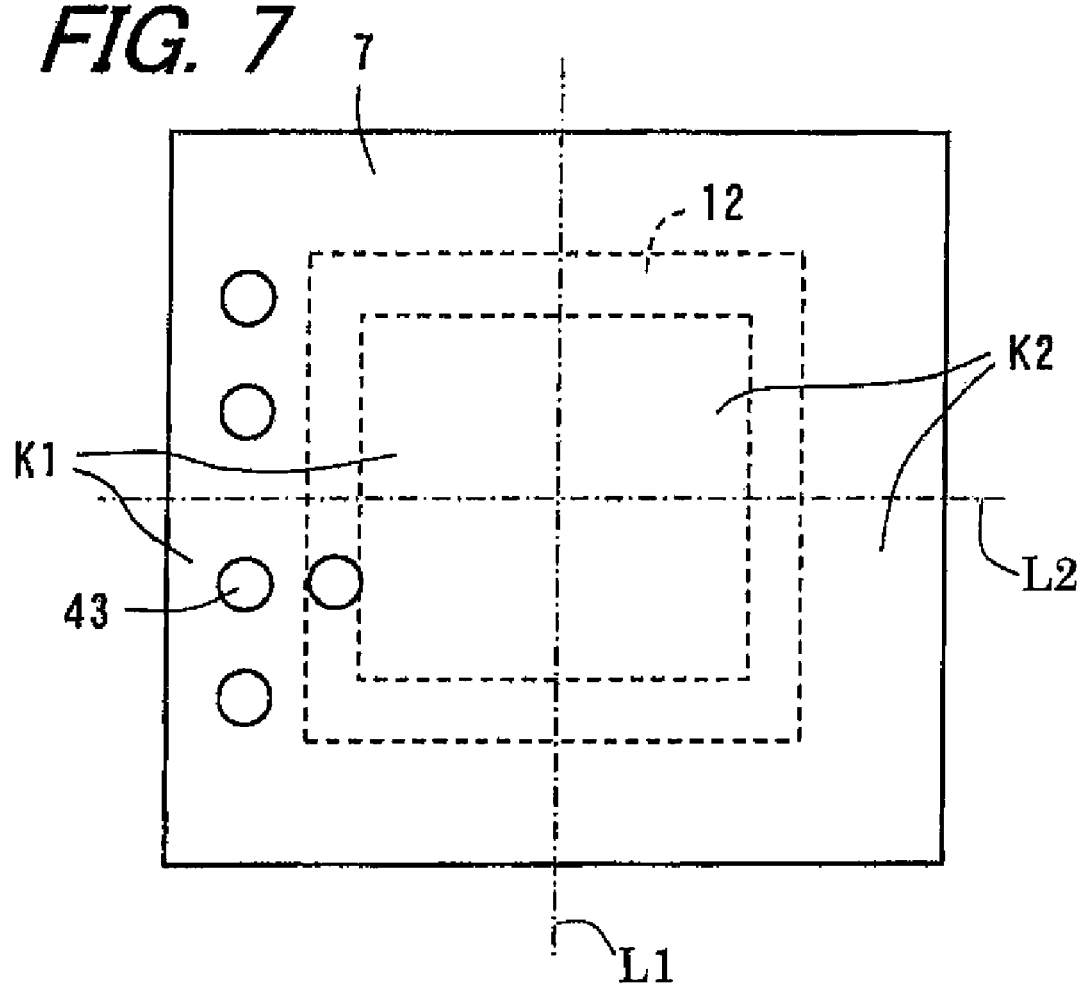
FIG. 7 is a plan view showing one of faces of the electronic component sealing substrate according to the third embodiment, on which mounting pads are formed.
Figure 8:
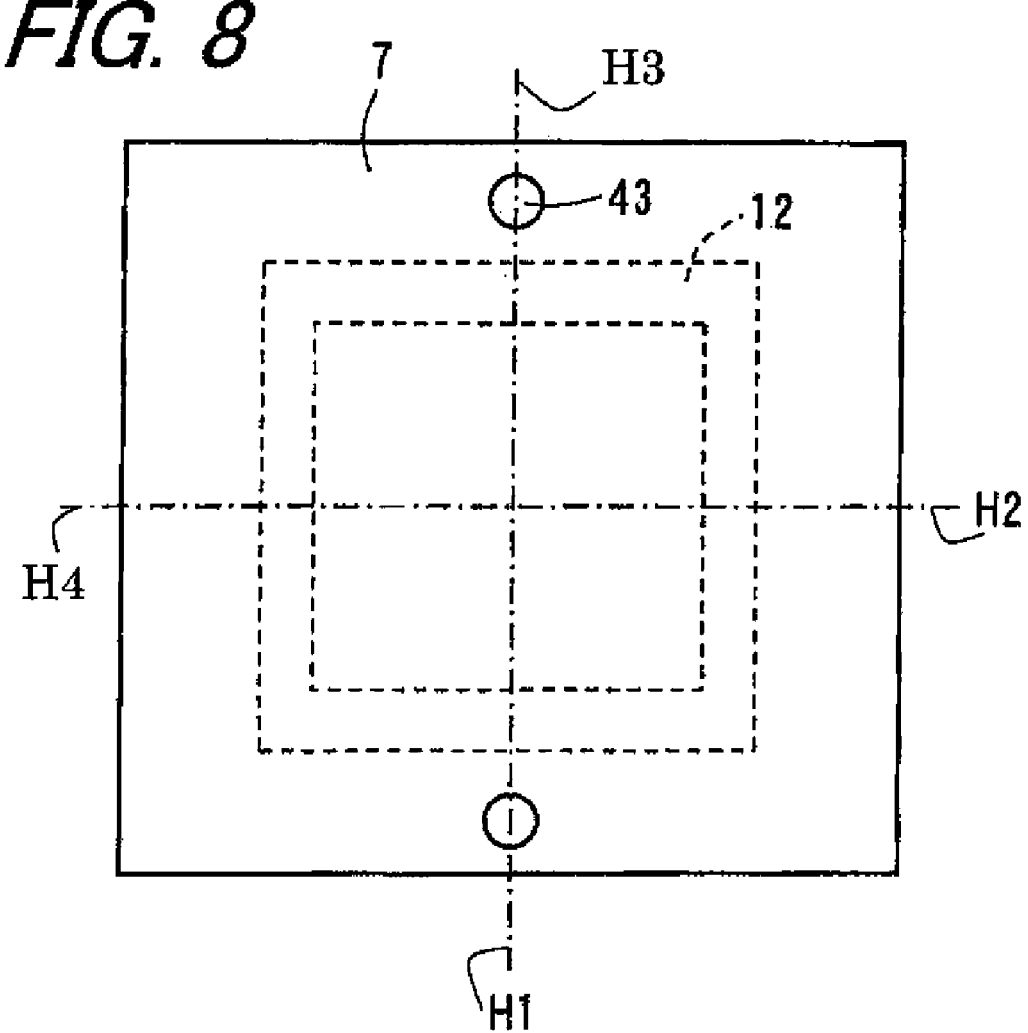
FIG. 8 is a plan view showing one of the faces of the electronic component sealing substrate according to the third embodiment, on which the mounting pads are formed.
Figure 9:
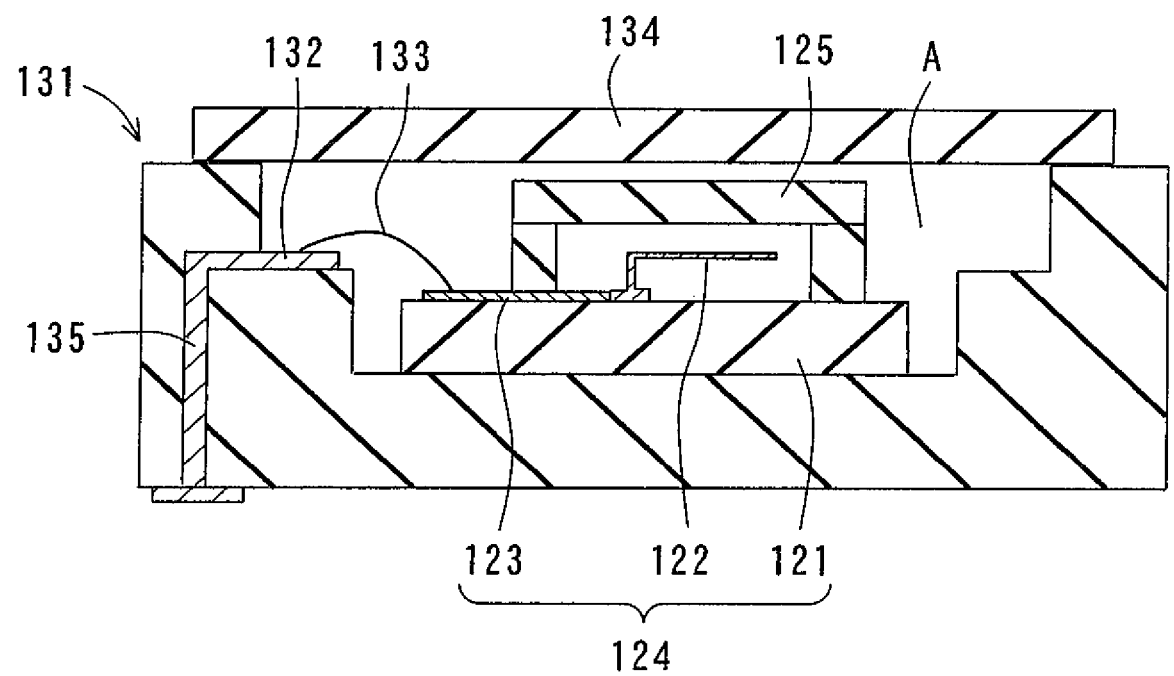
FIG. 9 is a cross-sectional view showing a configuration example of a conventional electronic component sealing substrate and a conventional electronic apparatus.

An electronic component sealing substrate according to the third embodiment of the invention is different from the apparatus for sealing the electronic component according to the first embodiment in that the mounting pads on one of the main faces of the insulating substrate 7 opposing the other main face closer to the semiconductor substrate 5 are arranged corresponding to the sealing position of the micro electronic mechanical system 3. FIG. 6 is a cross-sectional view showing a configuration example of an electronic apparatus that includes an electronic component sealing substrate according to the third embodiment of the invention. FIGS. 7 and 8 are plan views of the electronic apparatus 41 shown in FIG. 6, and schematically show the arrangement of mounting pads 42 on the insulating substrate 7. In FIG. 5, the same configurations as in FIGS. 1A and 1B to FIGS. 4A to 4D are denoted by the same reference numerals, and a description thereof has been omitted.

In FIG. 5, the micro electronic mechanical system 3 has a double cantilever structure in which a beam-shaped vibrating portion is supported between a pair of columnar support portions. In the micro electronic mechanical system 3 having the double cantilever structure, when an extremely small voltage is applied between an upper electrode (not shown) formed on the vibrating portion and a lower electrode (not shown) formed on the semiconductor substrate 5, the vibrating portion moves closer to the lower electrode due to an electrostatic phenomenon. When the application of the voltage stops, the vibrating portion moves away from the lower electrode to the original state. With such an operation of the vibrating portion, a function of an optical modulator that modulates the intensity of reflected light by changing the height of the upper electrode, and a function of a frequency filter that vibrates the vibrating portion at a specific frequency are realized.

FIG. 7 is a plan view showing one of the faces of an electronic component sealing substrate 42 according to this embodiment, on which the mounting pads 43 are formed. For facilitating the understanding of the arrangement of the mounting pads 43, FIG. 7 has been simplified, and the sealing member 12 is seen through the insulating substrate 7.

As shown in FIG. 7, in the electronic component sealing substrate 42 according to this embodiment, mounting regions are regions in which the mounting pads 43 oppose three or less divided regions among four divided regions K1, K2 obtained by dividing the main face of the insulating substrate 7 into quarters along two dividing lines L1, L2 (indicated as dashed dotted lines in FIG. 7) that pass through the center of the electronic component sealing region inside the sealing member 12.

When the mounting pads 43 are arranged in regions opposing three or less divided regions among the four divided regions in this manner, a region opposing at least one divided region is not mechanically connected via the mounting pads 43 to an external electric circuit board. Thus, no stress is generated in this region. Accordingly, stress that acts on the electronic component sealing substrate 42 can be kept low in at least one divided region. Furthermore, in such a divided region in which stress is kept low (hereinafter, referred to as a 'low stress region'), strain is also small. Thus, strain can be kept small also in a region of the semiconductor substrate 5 opposing this divided region.

More specifically, when the electronic component sealing substrate 42 is deformed by stress generated by the difference between the coefficients of thermal expansion, stress generated in the semiconductor substrate 5 of the electronic component 2 is high in regions of the electronic component 2 opposing the mounting regions, and is low in a portion away from the regions of the electronic component 2 opposing the mounting regions. Thus, a region of the semiconductor substrate 5 opposing at least one divided region in which no mounting pad 43 is disposed can be formed as a low stress region. Herein, when the micro electronic mechanical system 3 is formed in this low stress region, for example, the micro electronic mechanical system 3 including the vibrating portion can be effectively prevented from being strained by the stress, and thus the drive precision of the micro electronic mechanical system 3 can be improved.

FIG. 7 shows an example in which the mounting pads 43 are arranged in regions of the lower face of the insulating substrate 7 opposing two divided regions. In this case, two divided regions K1 opposing the two mounting regions in which the mounting pads 43 are arranged, and two divided regions K2 in which no mounting pad 43 is disposed are present on the lower face of the electronic component sealing substrate 42. Regions of the semiconductor substrate 5 opposing the two divided regions K2 are low stress regions in which strain is small. When the micro electronic mechanical system 3 (not shown in FIG. 3) is formed in the low stress regions, the micro electronic mechanical system 3 can be effectively prevented from being strained by stress or the like generated by the difference between the coefficients of thermal expansion, and thus the drive precision of the micro electronic mechanical system 3 can be improved. In this example, the micro electronic mechanical system 3 can be formed in regions of the semiconductor substrate 5 opposing approximately half of the regions on the main face of the insulating substrate 7.

Note that it is necessary to provide at least one mounting pad 43 in order to mount the electronic apparatus 41, and thus the mounting pad 43 is disposed in a region opposing at least one of the divided regions.

The number of regions on which the mounting pads 43 are mounted among the regions opposing the four divided regions, and the manner in which the mounting pads 43 are mounted may be adjusted as appropriate according to, for example, the shape, the size, and the functions of the micro electronic mechanical system 3, the planar dimension of the electronic component 2, and the inclination with respect to the external electric circuit board.

Furthermore, as shown in FIG. 8, the mounting pads 43 may be arranged on lines opposing three or less dividing half lines among four dividing half lines H1, H2, H3, H4 (indicated as dashed dotted lines in FIG. 8) that divide the electronic component sealing region inside the sealing member 12 into quarters and that extend from the center of the electronic component sealing region to an outer periphery thereof.

FIG. 8 is a plan view showing one of the faces of the electronic component sealing substrate 42 on which the mounting pads 43 are formed. For facilitating the understanding of the arrangement of the mounting pads 43, FIG. 8 has been simplified, and the sealing member 12 is seen through the insulating substrate 7, as in FIG. 7.

When the mounting pads 43 are arranged on lines opposing three or less dividing half lines among the four dividing half lines H1, H2, H3. H4 in this manner, stress that acts on the electronic component sealing substrate 42 can be kept low along at least one dividing half line. Furthermore, in a region including, such a dividing half line, strain is also small. Thus, strain can be kept small also in a region of the semiconductor substrate 5 opposing this dividing half line.

In this manner, a low stress region can be formed on the semiconductor substrate 5, in a region vertically opposing a region including at least one dividing half line. Herein, when the micro electronic mechanical system 3 is formed in this low stress region, for example, the micro electronic mechanical system 3 including the vibrating portion can be effectively prevented from being strained or deformed by the stress, and thus the drive precision of the micro electronic mechanical system 3 can be improved.

Moreover, in a case where the micro electronic mechanical system 3 has the configuration in which a beam-shaped vibrating portion is disposed between ends of a pair of columnar support portions, the following effect also can be obtained.

In a case where the mounting pads 43 are arranged on dividing half lines, the support portions of the micro mechanical electronic system 3 can be arranged so as to stride over the region opposing the mounting pads 43. In other words, the support portions susceptible to mechanical damage can be formed in low stress regions. Thus, for example, the design freedom of the micro electronic mechanical system 3 having a so-called double cantilever structure (structure in which a beam-shaped vibrating portion is supported between a pair of columnar support portions) can be improved.

FIG. 8 shows a case in which the mounting pads 43 are arranged in one line along a line opposing two dividing half lines H1, H3 that are linked to be one straight line, among the four dividing half lines. H1, H2, H3,H4.

In this case, two dividing half lines H1, H3 that each have one mounting pad 43 disposed thereon and that are linked to be one straight line, and two dividing half lines H2, H4 that do not have a mounting pad 43 disposed thereon and that form a right angle with the dividing half lines H,H3 are present on the lower fate of the insulating substrate 7. In the semiconductor substrate 5, the regions other than the linear regions opposing the two dividing half lines on which the mounting pads 43 are arranged are low stress regions in which strain is small. When the micro electronic mechanical system 3 is formed in the low stress regions, the micro electronic mechanical system 3 can be effectively prevented from being strained by stress or the like generated by the difference between the coefficients of thermal expansion, and thus the drive precision of the micro electronic mechanical system 3 can be improved.

For example, in a case where the mounting pads 43 are arranged as shown in FIG. 8, when the micro electronic mechanical system 3 having a double cantilever structure is formed on the semiconductor substrate 5, the support portions of the micro electronic mechanical system 3 may be arranged on the semiconductor substrate 5 so as to stride over linear regions opposing the dividing half lines H1, H3 on which the mounting pads 43 are arranged. In this manner, the support portions of the micro electronic mechanical system 3 having a double cantilever structure can be respectively positioned in the low stress regions. Thus, the support portions can be effectively prevented from being strained. Even when the electronic apparatus 41 is heated or copied, the drive precision can be kept high. Furthermore, two support portions can be formed also in a region of the semiconductor substrate 5 opposing the dividing half line H2, H4 on which no mounting pad 43 is disposed. Thus, the design freedom of the arrangement position or the like of the micro electronic mechanical system 3 can be improved. It should be noted that the arrangement of the mounting pads 43 is not limited to the examples shown in FIGS. 7 and 8.

Although not shown in FIGS. 6 to 8, a projecting portion for securing a constant gap between the electronic component sealing substrate 42 and the external electric circuit board is preferably provided on the lower face of the insulating substrate 7 on which the mounting pads 43 are arranged. The projecting portion is, for example, attached to the insulating substrate 7 or formed together with the insulating substrate 7 such that the lower end face of the projecting portion is at the same height as the external terminals 17 for joining the mounting pads 43 of the electronic apparatus 12 to the external electric circuit board. The projecting portion is, for example, disposed at a portion where no mounting pad 43 is disposed, on the lower face of the insulating substrate 7, and functions as a spacer that secures a constant gap between the lower face of the insulating substrate 7 and the upper face of the external electric circuit board. With this projecting portion, the electronic apparatus 41 and the external electric circuit board can be easily kept parallel when the electronic apparatus 41 is mounted on the external electric circuit board.

In this case, when the projecting portion is disposed in a region outside the mounting regions, in which no mounting pad 43 is disposed, the projecting portion can support the electronic apparatus 41. Thus, this configuration is effective in keeping the electronic apparatus 41 and the external electric circuit board parallel. Herein, it is necessary not to join the projecting portion to the external electric circuit board in the regions other than the mounting regions. When the projecting portion is joined to the external electric circuit board, thermal stress is applied via the projecting portion to the insulating substrate 7 of the electronic apparatus 41, and problems such as strains of the micro electronic mechanical system 3 may occur.

For example, when a projecting portion made of a material whose elastic modulus (Young's modulus) is lower than that of the external terminal is disposed close to the mounting pads 43, in a case where an external force is applied to the electronic apparatus 41 that has been mounted on the external electric circuit board, stress is distributed also to an interface between the projecting portion and the insulating substrate 7 of the electronic apparatus 41, and the stress can be effectively reduced by deformation of the projecting portion. Thus, stress being concentrated at the mounting pads 43 and damage to the electronic apparatus 41 starting from the mounting pads 43 can be suppressed.

Various material such as a ceramic material, a metal material, and a resin material may be used for the projecting portion, as long as the projecting portion made of such a material is not joined to the external electric circuit, and is at the same height as or lower than the external terminal 17 constituted by a solder bump or the like. The projecting portion can be easily formed without an additional formation process, by forming the projecting portion all at once with the insulating substrate 7 that is made of a ceramic material, or by forming a solder bump that is to be formed into the external terminal 17 after forming a solder bump that is to be formed into the projecting portion using solder balls or the like made of a high-melting solder on the electronic component sealing substrate 42. Furthermore, in a case where the projecting portion is made of a resin material, such as silicone, whose elastic modulus is low, stress generated when an external force is applied to the electronic apparatus 41 can be effectively reduced, and mechanical reliability can be improved. This projecting portion may be formed at any desired position such as a region in which no mounting pad 43 is disposed or a portion adjacent to the mounting pads 43, according to the arrangement or the like of the mounting pads 43, as described above. For example, in a case where the number of the mounting pads 43 is small, when importance is attached to keeping the electronic apparatus 41 and the external electric circuit board parallel, the projecting portion that is not joined to the external electric circuit board may be disposed in a region outside the mounting regions, and when importance is attached to prevention of damage to the mounting pads 43, the mounting pads 43 whose elastic modulus is low may be disposed close to the mounting pads 43.

Although the invention has been described about the specific embodiments, other many variations, modifications or applications will be obvious for one having ordinary skill in the art. Accordingly, the invention is not limited to the specific disclosure in the specification, and can be limited by only the appended claims.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

INDUSTRIAL APPLICABILITY

3 According to the invention, an electronic component sealing substrate for hermetically sealing a micro electronic mechanical system of an electronic component that includes a semiconductor substrate, the micro electronic mechanical system formed on a main face of the semiconductor substrate, and an electrode electrically connected to the micro electronic mechanical system, comprises an insulating substrate that has a first main face joined to the main face of the semiconductor substrate so as to hermetically seal the micro electronic mechanical system; and a wiring conductor that has an end extending to the first main face of the insulating substrate and is electrically connected to the electrode of the electronic component, wherein the end of the wiring conductor is positioned outside a joined portion of the main face of the semiconductor substrate and the first main face of the insulating substrate. Thus, it is possible to suppress the influence of electromagnetic coupling and radio frequency noises between the electrical connection path and the micro electronic mechanical system.

According to the invention, an electronic component sealing substrate to be divided into a plurality of pieces comprises a plurality of regions each of which constitutes an electronic component sealing substrate. Thus, it is possible to produce an electronic apparatus at high productivity, in which the influence of electromagnetic interferences and radio frequency noises between the electrical connection path and the micro electronic mechanical system is suppressed.

According to the invention, an electronic apparatus comprises the electronic component sealing substrate and an electronic component. Thus, it is possible to provide an electronic-apparatus in which the influence of electromagnetic interferences and radio frequency noises between the conductive junction member and the micro electronic mechanical system is suppressed.

According to the invention, a method for producing an electronic apparatus comprises a step of preparing an electronic component substrate to be divided into a plurality of pieces in which a plurality of electronic component regions in each of which a micro electronic mechanical system and an electrode electrically connected to the micro electronic mechanical system are formed on a semiconductor substrate; a step of preparing the an electronic component sealing substrate to be divided into a plurality of pieces; a step of hermetically sealing the micro electronic mechanical system, by electrically connecting the respective electrodes of the electronic component substrate to be divided into a plurality of pieces and the end of the corresponding wiring conductor, and joining a main face of the semiconductor substrate and one main face of the insulating substrate; and a step of dividing a joined member of the electronic component substrate to be divided into a plurality of pieces and the electronic component sealing substrate to be divided into a plurality of pieces, into the electronic component regions. Thus, it is possible to produce an electronic apparatus at high productivity, in which the influence of electromagnetic interferences and radio frequency noises between the electrical connection path and the micro electronic mechanical system is suppressed.

The invention claimed is:

1. An electronic component sealing substrate for hermetically sealing a micro electronic mechanical system of an electronic component that includes a semiconductor substrate, the micro electronic mechanical system formed on a surface of the semiconductor substrate, and an electrode electrically connected to the micro electronic mechanical system, comprising:

an insulating substrate that has a first main face joined to the surface of the semiconductor substrate so as to hermetically seal the micro electronic mechanical system;

a first wiring conductor that has an end extending to the first main face of the insulating substrate and is electrically connected to the electrode of the electronic component; and an annular conductive pattern disposed on the first main face of the insulating substrate, said annular conductive pattern having a shape configured for internally accommodating the micro electronic mechanical system, the end of the first wiring conductor being positioned outside the annular conductive pattern.

2. The electronic component sealing substrate of claim 1, further comprising:

a conductive sealing member that is disposed on the annular conductive pattern and seals the micro electronic mechanical system; and a second wiring conductor that has an end extending to the first main face of the insulating substrate and is electrically connected to the annular conductive pattern.

3. The electronic component sealing substrate of claim 1, further comprising a conductor layer to which a reference potential is supplied, inside the insulating substrate.

4. The electronic component sealing substrate of claim 3, further comprising a conductive sealing member that is disposed on the annular conductive pattern and seals the micro electronic mechanical system,
  wherein the sealing member is electrically connected to the conductor layer via the annular conductive pattern.

5. The electronic component sealing substrate of claim 1, further comprising:
  at least one pair of capacitance forming electrodes that are formed inside the insulating substrate and are electrically connected to the first wiring conductor; and
  a resistor that is formed inside the insulating substrate and is electrically connected to the capacitance forming electrodes.

6. The electronic component sealing substrate of claim 5, wherein relative permittivity of the insulating substrate between the capacitance forming electrodes is higher than that of the other regions.

7. The electronic component sealing substrate of claim 5, further comprising a connection pad that is formed on the first main face of the insulating substrate and is electrically connected to the end of the first wiring conductor,
  wherein the resistor is disposed directly under the connection pad inside the insulating substrate, and
  a distance between the capacitance forming electrodes and the connection pad is longer than that between the resistor and the connection pad.

8. The electronic component sealing substrate of claim 7, wherein the resistor is constituted by the connection pad or a part of the first wiring conductor adjacent to the connection pad.

9. The electronic component sealing substrate of claim 5, wherein a conductor layer to which a reference potential is supplied, is disposed between the first main face and the capacitance forming electrodes of the insulating substrate.

10. The electronic component sealing substrate of claim 1, further comprising a plurality of mounting pads that are formed on a second main face opposing the first main face of the insulating substrate,
  wherein the mounting pads are arranged in mounting regions on the second main face, and
  the mounting regions oppose no more than three divided regions among four divided regions on the first main face, obtained by dividing the first main face along dividing lines that pass through a center of an internal region of the annular conductive pattern and that divide the region into quarters.

11. The electronic component sealing substrate of claim 1, further comprising a plurality of mounting pads that are formed on a second main face opposing the first main face of the insulating substrate,
  wherein the mounting pads are arranged on mounting lines on the second main face, and
  the mounting lines oppose no more than three dividing half lines among four dividing half lines on the first main face that divide an internal region of the annular conductive pattern into quarters and that extend from a center of the region to an outer periphery thereof.

12. An electronic apparatus, comprising:
  an electronic component that includes a semiconductor substrate, a micro electronic mechanical system formed on a surface of the semiconductor substrate, and an electrode electrically connected to the micro electronic mechanical system;
  an insulating substrate that has a first main face opposing the surface of the semiconductor substrate;
  a first wiring conductor that has an end extending to the first main face of the insulating substrate and is electrically connected to the electrode of the electronic component;
  an annular conductive pattern that is disposed on the first main face of the insulating substrate, said annular conductive pattern having a shape configured for internally accommodating the micro electronic mechanical system; and
  a sealing member that is disposed on the annular conductive pattern between the surface of the semiconductor substrate and the first main face of the insulating substrate, and seals the micro electronic mechanical system,
  the end of the first wiring conductor being positioned outside the annular conductive pattern.

13. The electronic apparatus of claim 12, wherein the electronic component sealing substrate comprises a conductor layer to which a reference potential is supplied, inside the insulating substrate, and
  the sealing member is made of a conductive material and electrically connected to the conductor layer.

14. The electronic apparatus of claim 12, further comprising a second wiring conductor that has an end extending to the first main face of the insulating substrate and is electrically connected to the annular conductive pattern,
  wherein the sealing member is made of a conductive material and electrically connected to the second wiring conductor via the annular conductive pattern.

15. The electronic apparatus of claim 12, further comprising:
  a connection pad that is formed on the first main face of the insulating substrate and is electrically connected to the end of the wiring conductor; and
  a conductive junction member that is formed on the connection pad and electrically connected to the electrode of the electronic component.

16. The electronic apparatus of claim 15, further comprising a resin material with which a space between the surface of the semiconductor substrate and the first main face of the insulating substrate is filled such that the conductive junction member is coated with the resin material toward an outside of the sealing member.

17. An electronic component sealing substrate for hermetically sealing a micro electronic mechanical system of an electronic component that includes a semiconductor substrate, the micro electronic mechanical system formed on a surface of the semiconductor substrate, and an electrode electrically connected to the micro electronic mechanical system, comprising:
  an insulating substrate that has a first main face joined to the surface of the semiconductor substrate so as to hermetically seal the micro electronic mechanical system;
  a wiring conductor that has an end extending to the first main face of the insulating substrate and is electrically connected to the electrode of the electronic component;
  at least one pair of capacitance forming electrodes that are formed inside the insulating substrate and are electrically connected to the wiring conductor; and
  a resistor that is formed inside the insulating substrate and is electrically connected to the capacitance forming electrodes,
  the end of the wiring conductor being positioned outside a joined portion of the surface of the semiconductor substrate and the first main face of the insulating substrate.

* * * * *